(12) United States Patent
Sasaki

(10) Patent No.: US 8,395,211 B2
(45) Date of Patent: Mar. 12, 2013

(54) SEMICONDUCTOR DEVICE AND METHOD FOR MANUFACTURING THE SAME

(75) Inventor: Yuji Sasaki, Kagoshima (JP)

(73) Assignee: Sony Corporation, Tokyo (JP)

(*) Notice: Subject to any disclaimer, the term of this patent is extended or adjusted under 35 U.S.C. 154(b) by 279 days.

(21) Appl. No.: 12/869,911

(22) Filed: Aug. 27, 2010

(65) Prior Publication Data

US 2011/0057255 A1    Mar. 10, 2011

(30) Foreign Application Priority Data

Sep. 4, 2009   (JP) ................. 2009-204661

(51) Int. Cl.
  *H01L 29/78* (2006.01)

(52) U.S. Cl. ........................................ 257/335

(58) Field of Classification Search .......... 257/329, 257/330, 335
See application file for complete search history.

(56) References Cited

U.S. PATENT DOCUMENTS

| | | | |
|---|---|---|---|
| 2006/0231917 A1* | 10/2006 | Ono et al. | 257/500 |
| 2007/0272977 A1* | 11/2007 | Saito et al. | 257/329 |
| 2010/0038712 A1* | 2/2010 | Watanabe et al. | 257/341 |

FOREIGN PATENT DOCUMENTS

JP    07-007154    1/1995

\* cited by examiner

*Primary Examiner* — Thomas L Dickey
(74) *Attorney, Agent, or Firm* — SNR Denton US LLP

(57) ABSTRACT

A semiconductor device includes a first conductive type semiconductor substrate; a first conductive type semiconductor region provided thereon in which first conductive type first pillar regions and second conductive type second pillar regions alternately arranged; second conductive type second semiconductor regions provided on second pillar regions in an element region to be in contact with first pillar regions therein; gate electrodes each provided on adjacent second semiconductor regions and on one of the first pillar region interposed therebetween; third semiconductor regions functioning as a first conductive type source region provided in parts of the second semiconductor regions located under side portions of the gate electrodes; and a second conductive type resurf region which is a part of a terminal region surrounding the element region and which is provided on first pillar regions and second pillar regions in the part of the terminal regions.

9 Claims, 17 Drawing Sheets

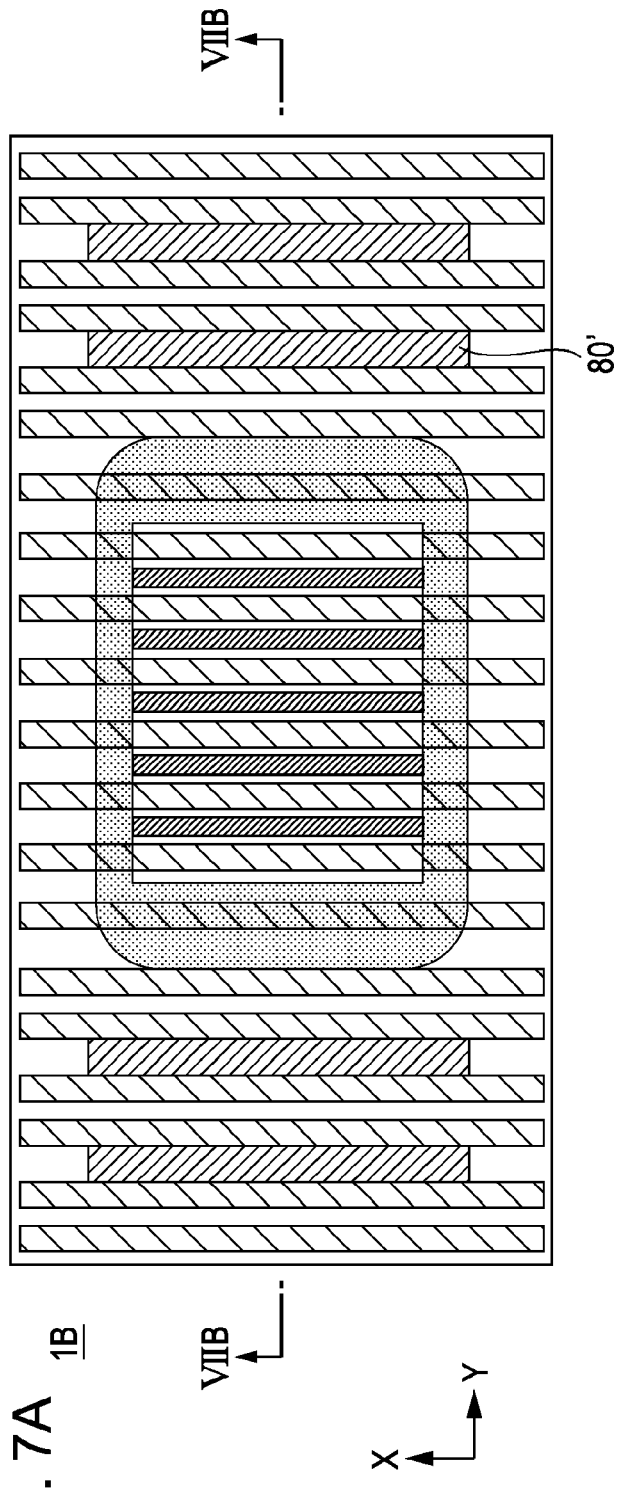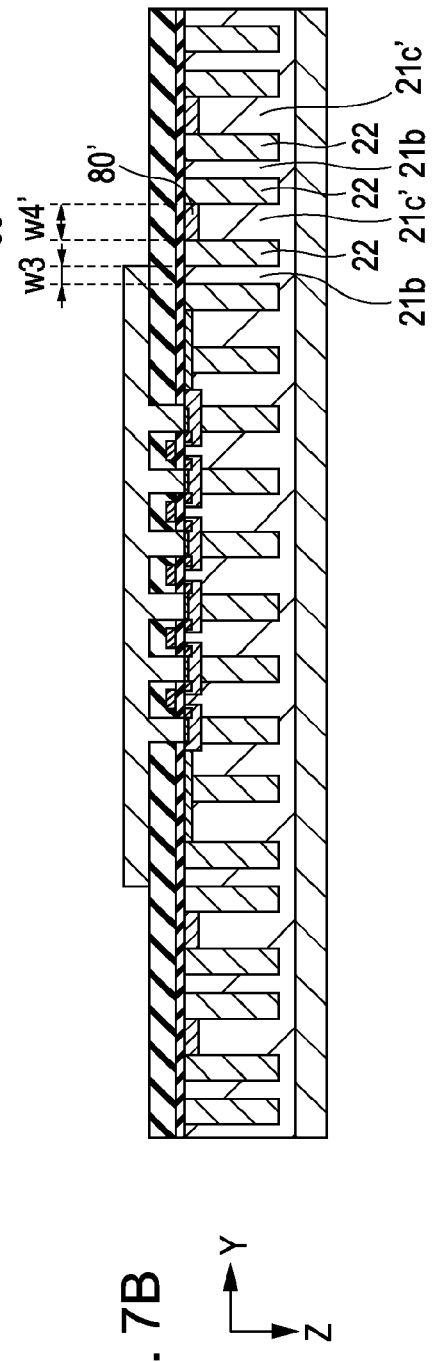

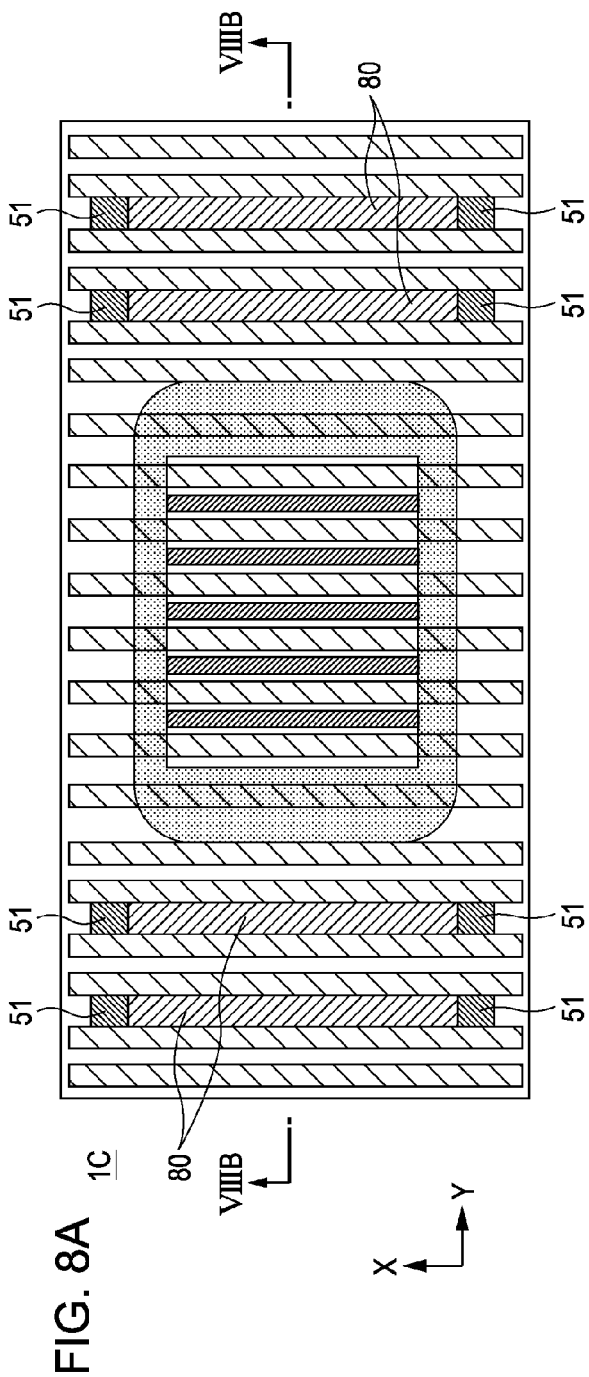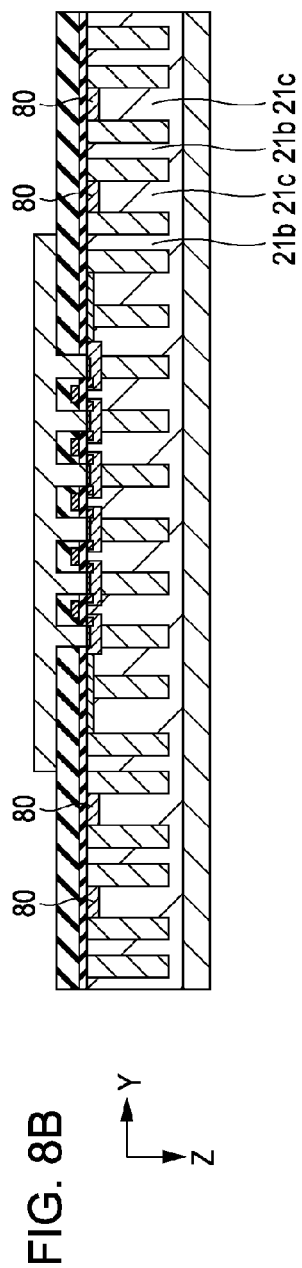
FIG. 8A
FIG. 8B

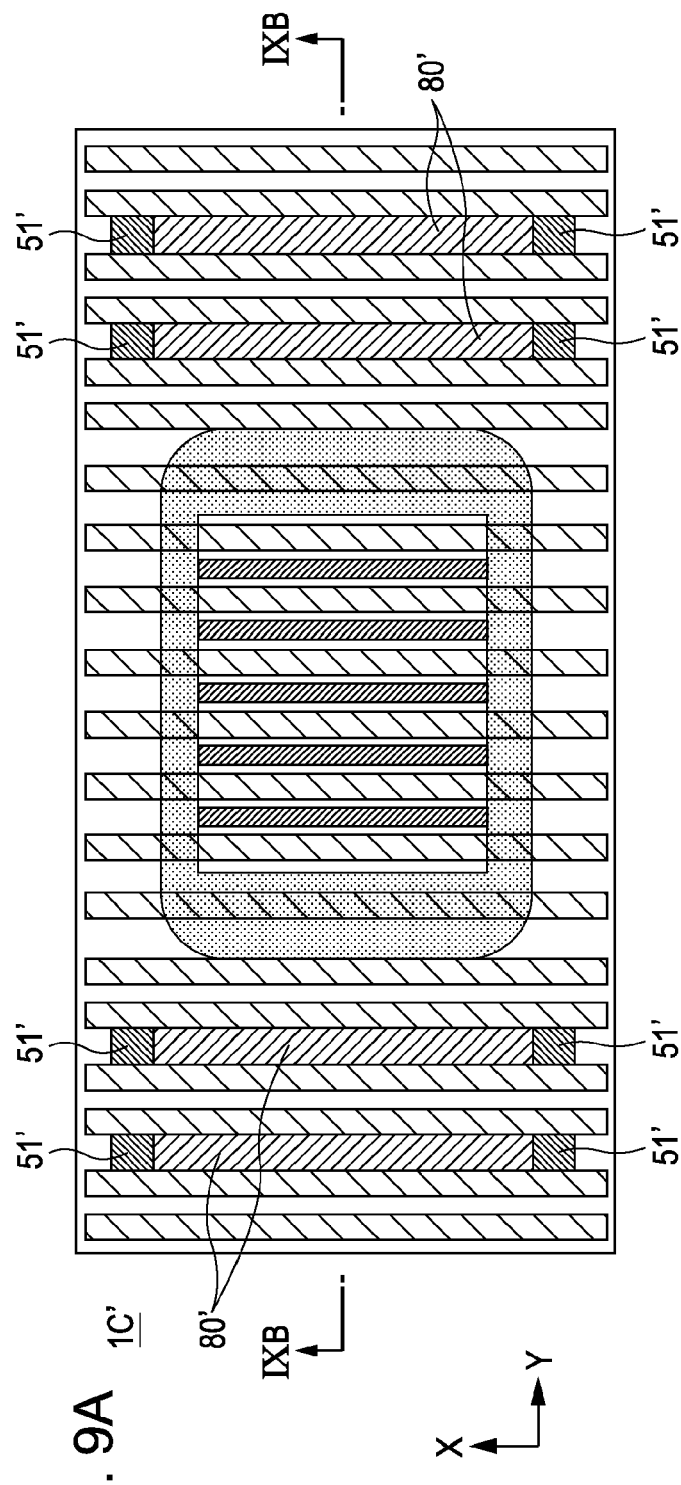
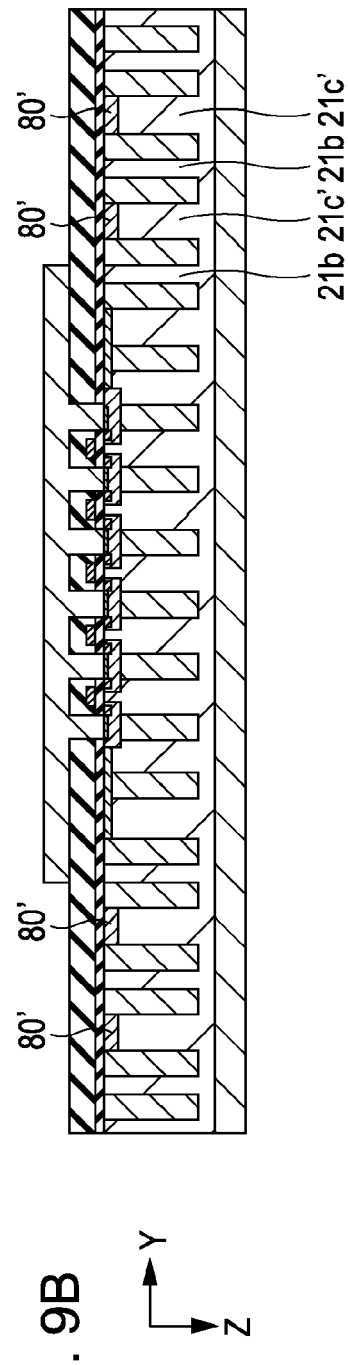

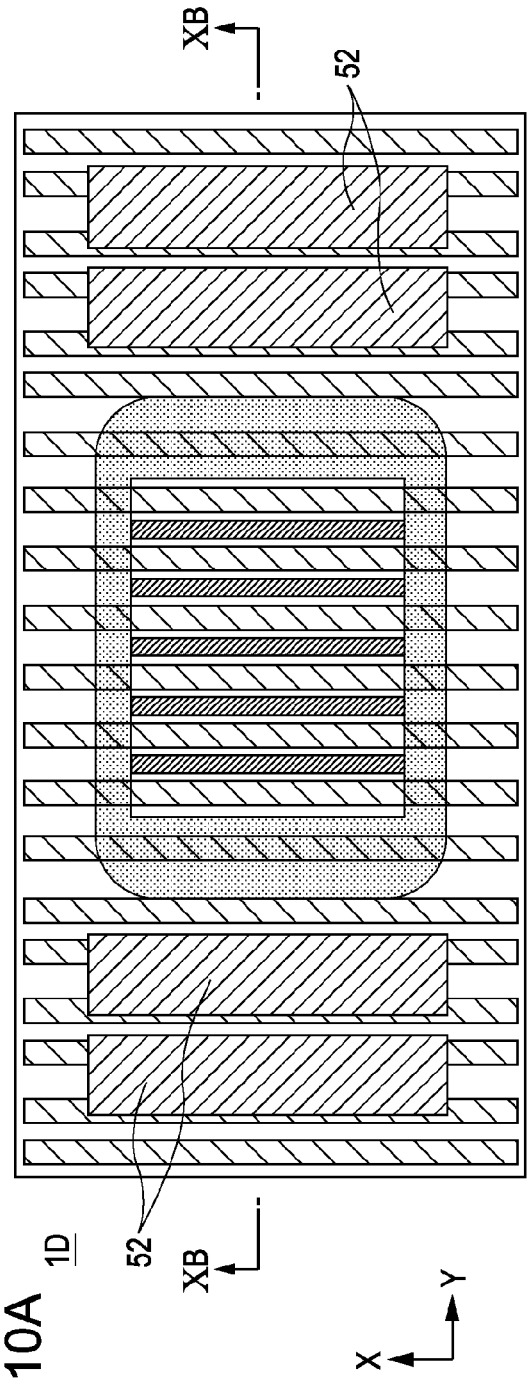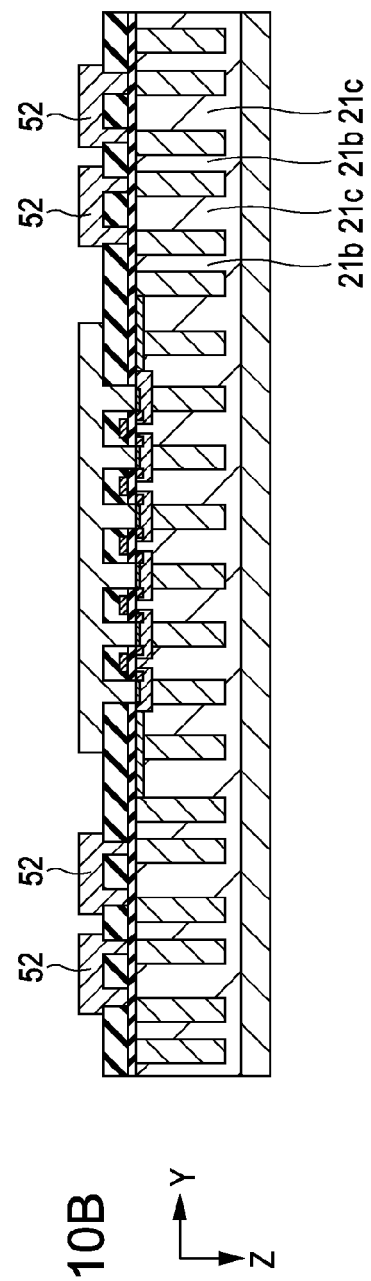
FIG. 10A
FIG. 10B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and more particularly relates to a semiconductor device including a vertical semiconductor element which has a super junction structure and a method for manufacturing the same.

2. Description of the Related Art

In recent years, reduction in thickness and weight of electronic apparatuses, such as a liquid crystal television, a plasma television, and an organic electroluminescent television, has been strongly requested. Concomitant with this trend, reduction in size and improvement in performances of electric power devices embedded in electronic apparatuses have also been strongly requested.

Accordingly, in power semiconductor elements used as electric power apparatuses, in particular, in a vertical type metal oxide semiconductor field effect transistor (hereinafter referred to as "MOSFET"), an improvement in performances, such as an increase in withstand voltage, an increase in amount of current, a decrease in loss, an increase in speed, and an increase in fracture resistance, has been aggressively carried out.

The on-resistance and the withstand voltage of a vertical MOSFET strongly depend on an impurity concentration of an n-type semiconductor region which functions as a conductive layer of the MOSFET. In order to decrease the on-resistance, it is necessary to increase the impurity concentration of the n-type semiconductor region. However, in order to ensure a desired withstand voltage, it is not allowed to increase the impurity concentration of the n-type semiconductor region to a certain level or more.

The withstand voltage and the on-resistance have a trade-off relationship. As one method to overcome the relationship mentioned above, a vertical MOSFET having a super junction structure has been proposed in which p-type semiconductor regions and n-type semiconductor regions are arranged in a stripe pattern in a region in which the withstand voltage has to be ensured (for example, see Japanese Unexamined Patent Application Publication No. 7-7154). In this vertical MOSFET (hereinafter referred to as "super junction vertical MOSFET"), a current is allowed to flow in the n-type semiconductor regions each functioning as a conductive layer in an ON state, and in an OFF state, the p-type semiconductor regions and the n-type semiconductor regions are completely depleted, so that the withstand voltage can be ensured.

SUMMARY OF THE INVENTION

As one method for manufacturing a super junction vertical MOSFET, a method for manufacturing an epitaxial-layer filled trench groove may be mentioned by way of example. In this method, first, an n-type semiconductor is formed on an n-type high concentration semiconductor substrate by an epitaxial process to have a thickness of several tens of micrometers, and trench grooves are then formed in this n-type semiconductor. Subsequently, a p-type semiconductor is grown to fill the trench grooves. As a result, a super junction structure is formed in which p-type semiconductors and n-type semiconductors each functioning as a p-type semiconductor pillar region and an n-type semiconductor pillar region, respectively, are alternately arranged side by side.

Since this method for manufacturing an epitaxial-layer filled trench groove is a simple process, has a small number of manufacturing steps, and includes no high-temperature long-time diffusion step, the widths and pitches of the n-type semiconductor pillar regions and the p-type semiconductor pillar regions can be decreased. Since the widths and the pitches can be decreased, the impurity concentration can be simultaneously increased. As a result, while a high withstand voltage is ensured, the on-resistance can be decreased.

However, in this method for manufacturing an epitaxial-layer filled trench groove, it is difficult to optionally and independently change and adjust the impurity concentration of the n-type semiconductor pillar region and that of the p-type semiconductor pillar region in an element region in which an MOSFET is formed and in a terminal region surrounding this element region. That is, a high withstand voltage has to be realized in both the terminal region and the element region at impurity concentrations equivalent to each other. Hence, in the terminal region, a high withstand voltage has to be realized by extending a depletion layer in a lateral direction while the impurity concentration of the p-type semiconductor pillar region and that of the n-type semiconductor pillar region are high.

Instead of the method for manufacturing an epitaxial-layer filled trench groove, by using a method for manufacturing a multi-epitaxial layer, the impurity concentration of the terminal region can be optionally adjusted. Hence, an increase in withstand voltage in the terminal region can be easily performed. In this method for manufacturing a multi-epitaxial layer, after an n-type semiconductor having a low impurity concentration is formed to have a thickness of several micrometers, a step of forming an n-type semiconductor super junction layer and a step of forming a p-type semiconductor super junction layer are repeated approximately 5 to 10 times by ion implantation using a resist mask, thereby forming a super junction vertical MOSFET.

According to this method for manufacturing a multi-epitaxial layer, an increase in withstand voltage in the terminal region can be easily realized. However, the process of this method is not simple as compared to that of a method for manufacturing an epitaxial-layer filled trench groove, and hence manufacturing is not easily performed at a low cost. Furthermore, since a high-temperature long-time diffusion step has to be performed, shrinkage and an increase in concentration of the super junction layer are difficult to realize.

Accordingly, it is desirable to provide a semiconductor device including a vertical semiconductor element which has a super junction structure capable of suitably realizing a high withstand voltage by a method for manufacturing an epi-taxial-layer filled trench groove and a method for manufacturing the semiconductor device described above.

According to an embodiment of the present invention, there is provided a semiconductor device which includes: a first conductive type semiconductor substrate; a first semiconductor region provided on an upper surface of the semiconductor substrate and including a region in which first conductive type first pillar regions and second conductive type second pillar regions, each having a long side in a first direction parallel to the upper surface of the semiconductor substrate, which are alternately arranged in a second direction which is parallel to the upper surface of the semiconductor substrate and which is orthogonal to the first direction; second conductive type second semiconductor regions provided on surfaces of second pillar regions in an element region in which a semiconductor element is formed so as to be in contact with first pillar regions in the element region; gate electrodes each provided on parts of adjacent second semiconductor regions and on one of the first pillar regions interposed therebetween with a gate insulating film provided under the gate electrodes; third semiconductor regions each functioning as a first conductive type source region provided in parts of surfaces of the second semiconductor regions located under side portions of the gate electrodes; and a second conductive type resurf region which is a part of a terminal region surrounding the element region and which is provided on first pillar regions and second pillar regions in the part of the terminal region. In the semiconductor device described above, the widths of the second pillar regions provided from the element region to the terminal region are each set as a first width, and the widths of the first pillar regions provided in the element region and the widths of the first pillar regions connected to the resurf region in the terminal region are each set as a second width; in first pillar regions which are provided in the terminal region and which are not connected to the resurf region, a first pillar region having a third width smaller than the second width and a first pillar region having a fourth width are alternately arranged in this order in a direction apart from the element region along the second direction; and in second pillar regions which are provided in the terminal region and which are not connected to the resurf region, adjacent second pillar regions with the first pillar region having a fourth width interposed therebetween are connected to each other with a connection portion composed of a second conductive type semiconductor or a conductor.

In the semiconductor device described above, the fourth width is set larger than the second width.

In the semiconductor device described above, the connection portion includes a second conductive type semiconductor having a concentration higher than that of the resurf region.

In the semiconductor device described above, the connection portion includes a metal wire.

In the semiconductor device described above, the length of the connection portion and the length of the resurf region are set equal to each other in the first direction, and the semiconductor device described above further includes second conductive type semiconductor regions having an impurity concentration equal to that of the resurf region and provided at two ends of the connection portion in the first direction.

In the semiconductor device described above, the first semiconductor region is a region formed by a process including the steps of forming a plurality of trench grooves in a first conductive type semiconductor layer provided on the upper surface of the semiconductor substrate to form the first pillar regions between the trench grooves and filling a second conductive type semiconductor in the trench grooves by an epitaxial growth to form the second pillar regions.

According to an embodiment of the present invention, there is provided a method for manufacturing a semiconductor device which includes the steps of: forming a first conductive type semiconductor layer on a first conductive type semiconductor substrate; forming trench grooves in the first conductive type semiconductor layer to form first conductive type first pillar regions between the trench grooves, the grooves each having a long side in a first direction parallel to an upper surface of the semiconductor substrate and being arranged in a second direction which is parallel to the upper surface of the semiconductor substrate and which is orthogonal to the first direction; filling a second conductive type semiconductor in the trench grooves by an epitaxial growth to form second conductive type second pillar regions; forming second conductive type second semiconductor regions on surfaces of second pillar regions in an element region in which a semiconductor element is formed so as to be in contact with first pillar regions in the element region; forming gate electrodes each provided on parts of adjacent second semiconductor regions and on one of the first pillar region interposed therebetween with a gate insulating film provided under the gate electrodes; forming third semiconductor regions each functioning as a first conductive type source region in parts of the second semiconductor regions located under side portions of the gate electrodes; and forming a second conductive type resurf region which is a part of a terminal region surrounding the element region on first pillar regions and second pillar regions in the part of the terminal region. In the manufacturing method described above, in the step of forming trench grooves, the trench grooves are formed so that the widths of the second pillar regions formed from the element region to the terminal region are each set as a first width, the widths of the first pillar regions formed in the element region and the widths of the first pillar regions connected to the resurf region in the terminal region are each set as a second width, and in first pillar regions which are provided in the terminal region and which are not provided with the resurf region thereon, a first pillar region having a third width smaller than the second width and a first pillar region having a fourth width are alternately arranged in that order in a direction apart from the element region along the second direction, and in second pillar regions which are formed in the terminal region and which are not connected to the resurf region, adjacent second pillar regions with the first pillar region having a fourth width interposed therebetween are connected to each other by forming a connection portion including a second conductive type semiconductor or a conductor.

According to an embodiment of the present invention, the structure can be provided in which in the terminal region of the semiconductor device having a super junction structure formed by a method for manufacturing an epitaxial-layer filled trench groove, the depletion layer can be more easily extended to the periphery of the element when the operation of the semiconductor element is placed in an OFF state and the generation of electric field concentration can be suppressed. As a result, in the terminal region, the charge balance can be obtained, and hence a stable semiconductor device having a high withstand voltage can be provided. Since the optimal terminal structure can be realized by a method for manufacturing an epitaxial-layer filled trench groove, the impurity concentration of the n-type semiconductor pillar region can be increased, and the on-resistance can be further decreased. Furthermore, since the manufacturing method is simple, manufacturing can be performed at a low cost.

BRIEF DESCRIPTION OF THE DRAWINGS

FIGS. 7A and 7B are views each illustrating the structure of a semiconductor device according to a second embodiment;

FIGS. 8A and 8B are views each illustrating the structure of a semiconductor device according to a third embodiment;

FIGS. 9A and 9B are views each illustrating the structure of another semiconductor device according to the third embodiment;

FIGS. 10A and 10B are views each illustrating the structure of a semiconductor device according to a fourth embodiment;

DESCRIPTION OF THE PREFERRED EMBODIMENTS

Hereinafter, a semiconductor device including a super junction vertical MOSFET (hereinafter simply referred to as "semiconductor device") according to an embodiment of the present invention will be described in detail with reference to the accompanying drawings.

First Embodiment (Structure of Semiconductor Device 1A)

Figure 1:
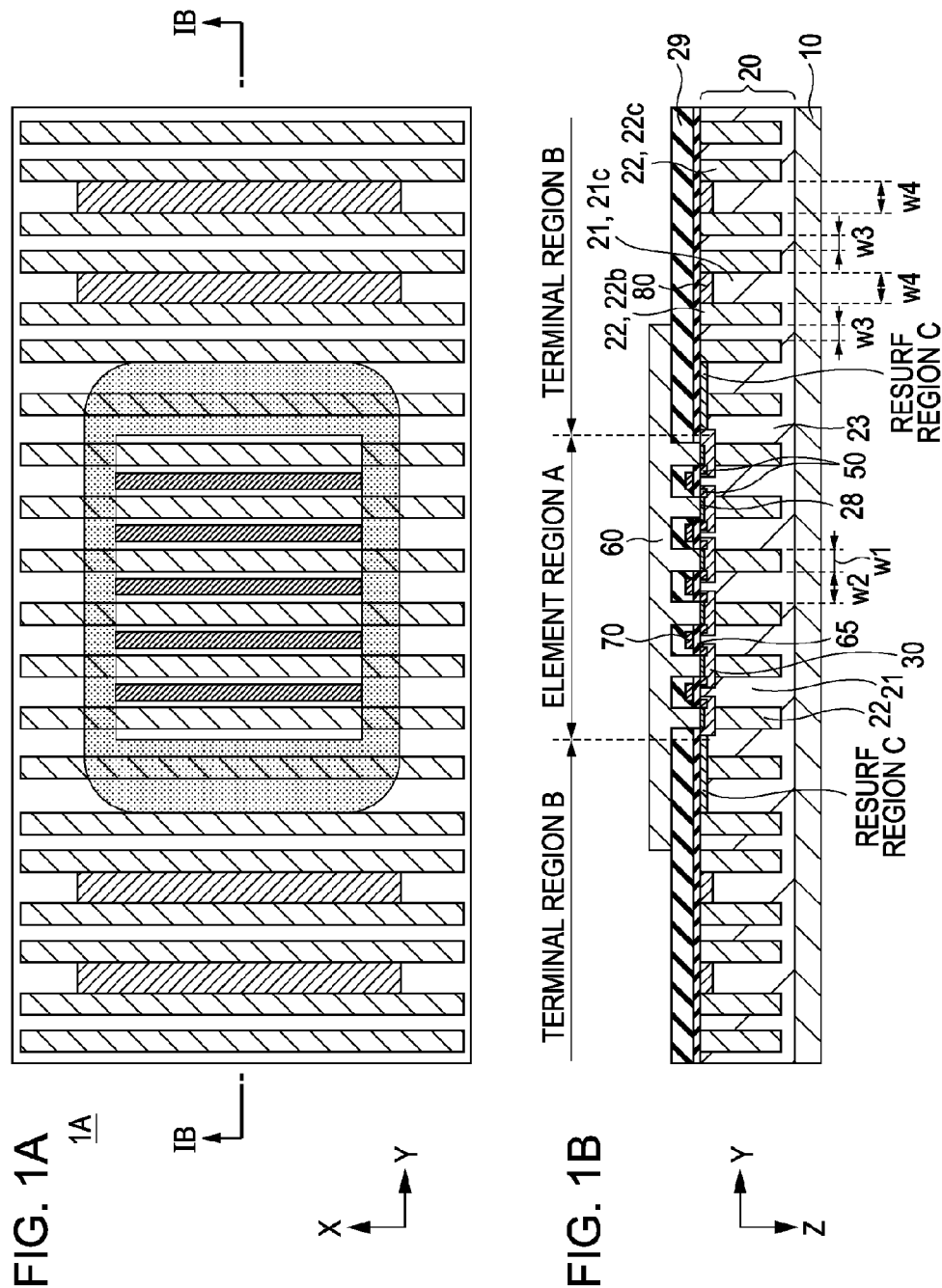
FIGS. 1A and 1B are views each illustrating the structure of a semiconductor device according to a first embodiment.

FIGS. 1A and 1B are views each illustrating the structure of a semiconductor device 1A according to a first embodiment. FIG. 1A is a schematic XY plan view showing the structure of the semiconductor device 1A, and FIG. 1B is a YZ cross-sectional view taken along the line IB-IB of FIG. 1A. Since the structure is shown by the schematic views, the dimensions are not limited to those shown in the figures, and the same thing can also be applied to the other embodiments. In FIG. 1B, in order to facilitate the understanding of the arrangement of n-type semiconductor pillar regions 21, p-type semiconductor pillar regions 22, gate electrodes 70, p$^+$-type semiconductors 80, and a resurf region C, which will be described later, some constituent elements are not shown in the figure.

The semiconductor device 1A according to the first embodiment includes an n-type high concentration substrate 10 (n$^+$-type drain layer) which is one example of a first conductive type semiconductor substrate having a relatively high impurity concentration. As this n-type high concentration substrate 10, for example, an n-type semiconductor, such as Si, containing phosphorus (P), arsenic (As) or antimony (Sb) as an n-type impurity at a concentration of $1 \times 10^{18}$ to $5 \times 10^{19}$/cm$^3$ may be mentioned. On a surface of the n-type high concentration substrate 10, a first semiconductor region 20 including an n-type epitaxial layer 23 having an impurity concentration lower than that of this n-type high concentration substrate 10 is formed.

In this first semiconductor region 20, the n-type semiconductor regions 21 (hereinafter referred to as "n-type semiconductor pillar regions 21") and the p-type semiconductor regions 22 (hereinafter referred to as "p-type semiconductor pillar regions 22") are alternately arranged to form a super junction region. The n-type semiconductor pillar region 21 is a region provided between adjacent p-type semiconductor pillar regions 22 in the n-type epitaxial layer 23.

The n-type semiconductor pillar regions 21 and the p-type semiconductor pillar regions 22 are each formed to have a pillar shape having a long side in an X axis direction (first direction) parallel to an upper surface of the n-type high concentration substrate 10. In addition, the n-type semiconductor pillar regions 21 and the p-type semiconductor pillar regions 22 are alternately arranged in a stripe pattern in a Y axis direction (second direction) parallel to the upper surface of the n-type high concentration substrate 10 and orthogonal to the X axis direction.

The n-type semiconductor pillar regions 21 and the p-type semiconductor pillar regions 22 are formed such that after trench grooves each having a long side in the X axis direction are formed in the n-type epitaxial layer 23 in the Y axis direction with intervals therebetween, a p-type semiconductor is filled in the trench grooves by an epitaxial growth. This manufacturing method will be described later in detail.

The n-type semiconductor pillar region 21 is formed by an epitaxial growth of an n-type semiconductor, such as Si, containing P as an n-type impurity at an impurity concentration of $2 \times 10^{15}$ to $2 \times 10^{16}$/cm$^3$. In addition, the p-type semiconductor pillar region 22 is formed by an epitaxial growth of a p-type semiconductor, such as Si, containing B as a p-type impurity at an impurity concentration of $2 \times 10^{15}$ to $2 \times 10^{16}$/cm$^3$. The width of the n-type semiconductor pillar region 21 in a short side direction (Y axis direction) is, for example, 2 to 5 μm. In addition, the width of the p-type semiconductor pillar region 22 in a short side direction (Y axis direction) is, for example, 2 to 5 μm, and the aspect ratio (long side direction/short side direction) is, for example, 10 to 20.

The n-type semiconductor pillar regions 21 and the p-type semiconductor pillar regions 22 are formed from an element region (element active region) A in which a MOSFET is formed to a terminal region B surrounding this element region A. The p-type semiconductor pillar region 22 functions as a p-type drift layer. In addition, the n-type semiconductor pillar region 21 functions as an n$^-$-type drift layer.

On surfaces of p-type semiconductor pillar regions 22 in the element region A, p-type semiconductor regions 30 are formed to be in contact with adjacent n-type semiconductor pillar regions 21 in the element region A. This p-type semiconductor region 30 is formed of a p-type semiconductor having an impurity concentration of $1 \times 10^{17}$ to $4 \times 10^{17}$/cm$^3$.

Source regions 50 each composed of an n-type semiconductor are formed in parts of surfaces of the p-type semiconductor regions 30, and a source electrode 60 composed of a metal layer is formed on the surfaces of the p-type semiconductor regions 30. The source region 50 is formed of an n-type semiconductor, such as Si, containing P or As as an n-type impurity at an impurity concentration, for example, of $1 \times 10^{19}/cm^3$ or more.

In addition, gate electrodes 70 are each formed on parts of adjacent p-type semiconductor regions 30 and an n-type semiconductor pillar region 21 interposed therebetween with a gate insulating film 65 provided under the gate electrodes 70. The source regions 50 are formed in parts of the surfaces of the p-type semiconductor regions 30 located under side portions of the gate electrodes 70.

In this semiconductor device 1A, a drain electrode (not shown) located at a lower surface side of the n-type high concentration substrate 10 functions as a high voltage electrode, and the source electrode 60 formed at an opposite side to the n-type high concentration substrate 10 functions as a low voltage electrode and is generally used at a ground voltage.

In the semiconductor device 1A of this embodiment, as described above, the super junction region composed of the n-type semiconductor pillar regions 21 and the p-type semiconductor pillar regions 22 is not only formed in the element region A but also formed in the terminal region B which is located along the periphery of the element region A. In addition, an interlayer insulating film 29 is formed on a surface of this terminal region B, and at a peripheral end of the terminal region B, a field stopper (not shown) is formed.

Furthermore, in this semiconductor device 1A, a p⁻-type reduced surface field (resurf) region C is formed on a part of the super junction region in this terminal region B so as to be adjacent to the periphery of the element region A. This resurf region C is a part of the terminal region B surrounding the element region A and is formed on n-type semiconductor pillar regions 21 and p-type semiconductor pillar regions 22 in the part of the terminal region B. This resurf region C is formed of a p-type semiconductor, such as Si, containing B as a p-type impurity at an impurity concentration of $1 \times 10^{16}$ to $3 \times 10^{17}/cm^3$.

When the MOSFET is in a non-conduction state, this resurf region C has a function to extend a depletion layer in right and left directions (Y axis direction shown in FIG. 1) of the terminal region B to suppress electric field concentration in the terminal region B.

Figure 2:
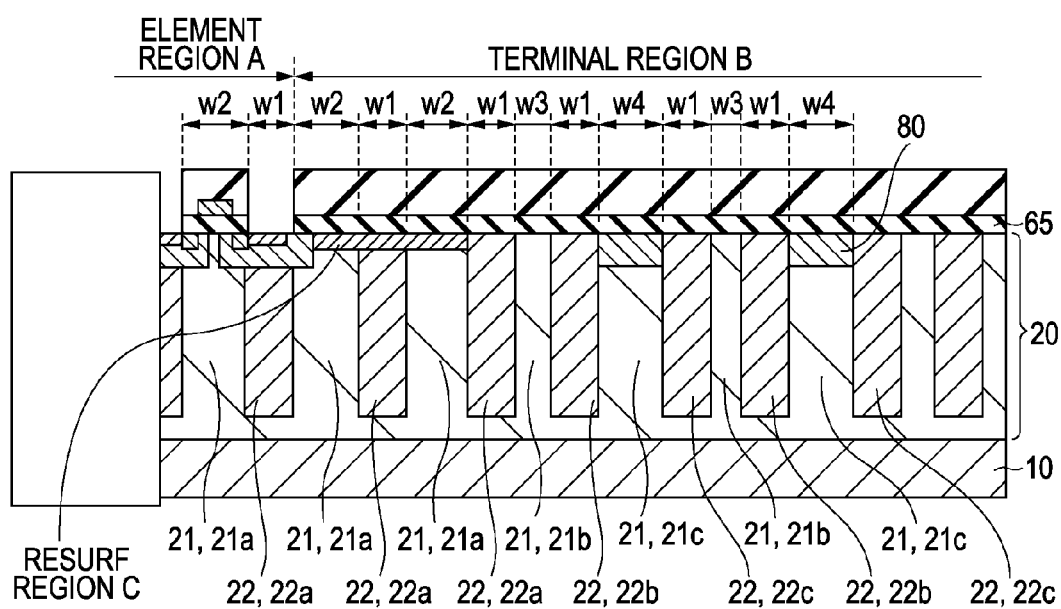
FIG. 2 is a view illustrating the structure of the semiconductor device according to the first embodiment.

As described above, in the semiconductor device 1A of this embodiment, the super junction region including the n-type semiconductor pillar regions 21 and the p-type semiconductor pillar regions 22 is formed from the element region A to the terminal region B including the resurf region C, and the following structure has particular features. With reference to FIG. 2 which is a partially enlarged view of FIG. 1B, the structure will be described.

First, the width of each p-type semiconductor pillar region 22, in other words, the width of each trench groove, is set as a uniform first width w1 from the element region A to the terminal region B. In addition, this first width w1 is not necessary to be uniform in a strict sense and may have an error of approximately ±5%.

As described above, since the widths of the p-type semiconductor pillar regions 22 are set uniform, when a p-type semiconductor is filled in the trench grooves by an epitaxial growth, filling can be uniformly performed in a wafer surface.

On the other hand, the width of each n-type semiconductor pillar region 21 inside the resurf region C is different from that outside the resurf region C. That is, the width of each n-type semiconductor pillar region 21a in the element region A is set as a second width w2, and as in the case described above, among n-type semiconductor pillar regions 21 in the terminal region B, the width of each n-type semiconductor pillar region 21a connected to the resurf region C is also set as the second width w2.

In addition, among the n-type semiconductor pillar regions 21 in the terminal region B, the width of each n-type semiconductor pillar region 21 which is not connected to the resurf region C is set as described below.

That is, in a direction apart from the element region A along the Y axis direction, n-type semiconductor pillar regions 21b having a third width w3 smaller than the second width w2 and n-type semiconductor pillar regions 21c having a fourth width w4 are alternately arranged.

In addition, the p⁺-type high concentration semiconductor 80 is formed on the n-type semiconductor pillar region 21c having a fourth width w4, and adjacent p-type semiconductor pillar regions 22b and 22c with the n-type semiconductor pillar region 21c having a fourth width w4 interposed therebetween are electrically connected to each other with the p⁺-type high concentration semiconductor 80. This p⁺-type high concentration semiconductor 80 has an impurity concentration approximately equivalent to that of the p-type semiconductor forming the p-type semiconductor region 30 in the element region A.

In this embodiment, the fourth width w4 of the n-type semiconductor pillar region 21c is set equivalent to the width of the n-type semiconductor pillar region 21a which is in the element region A or which is connected to the resurf region C, that is, is set equivalent to the second width w2.

In addition, in the semiconductor device 1A, as shown in FIGS. 1A, 1B, and 2, at least two pairs of the p-type semiconductor pillar regions 22b and 22c connected to each other with the p⁺-type semiconductor 80 interposed therebetween are provided.

By the semiconductor device 1A having the structure as described above, when the MOSFET is in an OFF state, that is, when the source electrode is at a ground potential, and a voltage is applied to the drain electrode, the super junction region of the element region A and that of the terminal region B are depleted. Hence, the depletion layer can be easily extended outside the resurf region C.

As a result, the electric field in the super junction region is uniformed, and the generation of points of electric field concentration can be suppressed, so that the withstand voltage of the MOSFET can be improved. Furthermore, a super junction vertical MOSFET which suppresses fluctuations caused by manufacturing variations can be provided.

(Mechanism of Improvement in Withstand Voltage)

Hereinafter, the mechanism will be described in which when an MOSFET is in an OFF state, the withstand voltage is improved by the structure described above. First, a phenomenon in a long side direction (X axis direction) and a depth direction (Z axis direction) of the p-type semiconductor pillar region 22 will be described.

When a voltage is applied to the n-type high concentration substrate 10 functioning as a drain electrode, the p-type semiconductor pillar region 22 connected to the source electrode 60 in the element region A is depleted. In this stage, in the region in which depletion occurs, the potential changes in accordance with the distance from the source electrode 60.

For example, when the source electrode 60 is at a ground potential, and the drain electrode is at 600 V, a region immediately under the source electrode 60 and that in the vicinity thereof are at a ground potential which is the same as that of the source electrode 60. However, in a long side direction (X axis direction) and a direction to the n-type high concentration substrate 10 (Z axis direction), the potential changes in accordance with the distance from the source electrode 60.

In addition, in a short side direction (Y axis direction) of the p-type semiconductor pillar region 22, the following phenomenon occurs.

When a voltage is applied to the drain electrode, in the element region A, a p-type semiconductor pillar region 22a electrically connected to the source electrode 60 is depleted. In addition, as in the case described above, a p-type semiconductor pillar region 22a connected to the resurf region C is also depleted when a voltage is applied to the drain electrode. In addition, as described above, the potential thereof changes in accordance with the length (distance) of the depletion layer from the source electrode 60 to the drain electrode.

On the other hand, in p-type semiconductor pillar regions 22 which are not electrically connected to the resurf region C, when the depletion layer reaches a p-type semiconductor pillar region 22b next to the resurf region C, the potential is first transmitted. That is, when no depletion layer reaches the p-type semiconductor pillar region 22b, the potential from the source electrode 60 is not transmitted.

Figure 3:
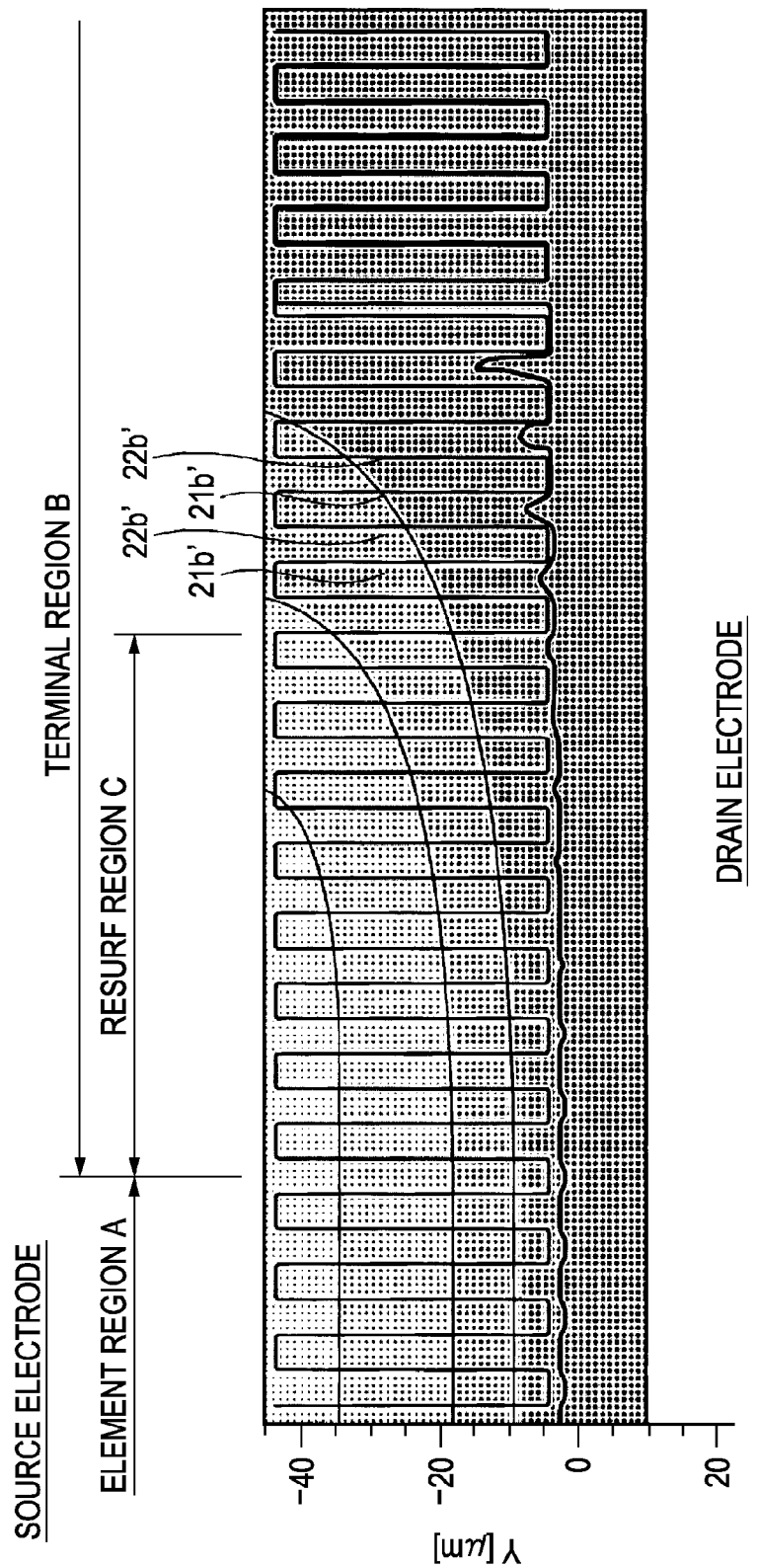
FIG. 3 is a view showing a potential distribution in a YZ plane of a semiconductor device prepared for comparison purpose.

In FIG. 3, a potential distribution in a YZ plane of a semiconductor device prepared for comparison purpose is shown. This semiconductor device prepared for comparison purpose is a semiconductor device in which the width of an n-type semiconductor pillar region 21b' which is not connected to the resurf region C in the terminal region B is set equal to the width of the n-type semiconductor pillar region 21a in the element region A, that is, to the second width w2.

As shown in FIG. 3, in the terminal region B except the resurf region C, p-type semiconductor pillar regions 22b' which are not depleted are present. These p-type semiconductor pillar regions 22b' are at a potential approximately equivalent to that of the drain electrode.

Accordingly, in the semiconductor device 1A, in the Y axis direction, the width of an n-type semiconductor pillar region 21b located outside the resurf region C and closest to the p-type semiconductor pillar region 22a connected to the resurf region C is decreased. As a result, the p-type semiconductor pillar region 22b can be more easily depleted.

In addition, in the semiconductor device 1A of this embodiment, the p$^+$-type high concentration semiconductor 80 is provided on the n-type semiconductor pillar regions 21c which is located further outside.

Accordingly, when the n-type semiconductor pillar region 21b is depleted, and the potential is transmitted to the p-type semiconductor pillar region 22b, since the p$^+$-type high concentration semiconductor 80 is present on the n-type semiconductor pillar region 21c, although the potential is transmitted to this p$^+$-type high concentration semiconductor 80, no depletion occurs therein. That is, surfaces of at least two p-type semiconductor pillar regions 22b and 22c connected with the p$^+$-type high concentration semiconductor are at potentials approximately equivalent to each other.

As a result, in the n-type semiconductor pillar region 21c under the p$^+$-type high concentration semiconductor 80, an electric field distribution parallel to the source electrode and the drain electrode is generated, and the generation of a portion at which the electric field strength is locally increased can be suppressed.

In addition, the width of an n-type semiconductor pillar region 21b located next to the n-type semiconductor pillar region 21c and further outside thereof is set as the third width w3 so as to be smaller than the width of the n-type semiconductor pillar region 21a in the element region A. As a result, depletion can be easily performed, and the potential can be easily transmitted to a p-type semiconductor pillar region 22b located further outside. As described above, when at least two sets each including the n-type semiconductor pillar region 21b having a small width and at least two p-type semiconductor pillar regions 22b and 22c connected to each other with the high concentration semiconductor are formed in the terminal region B, a high withstand voltage can be realized in the terminal region B. Furthermore, a device can be provided which suppresses fluctuations caused by variations of the manufacturing process.

Figure 4:
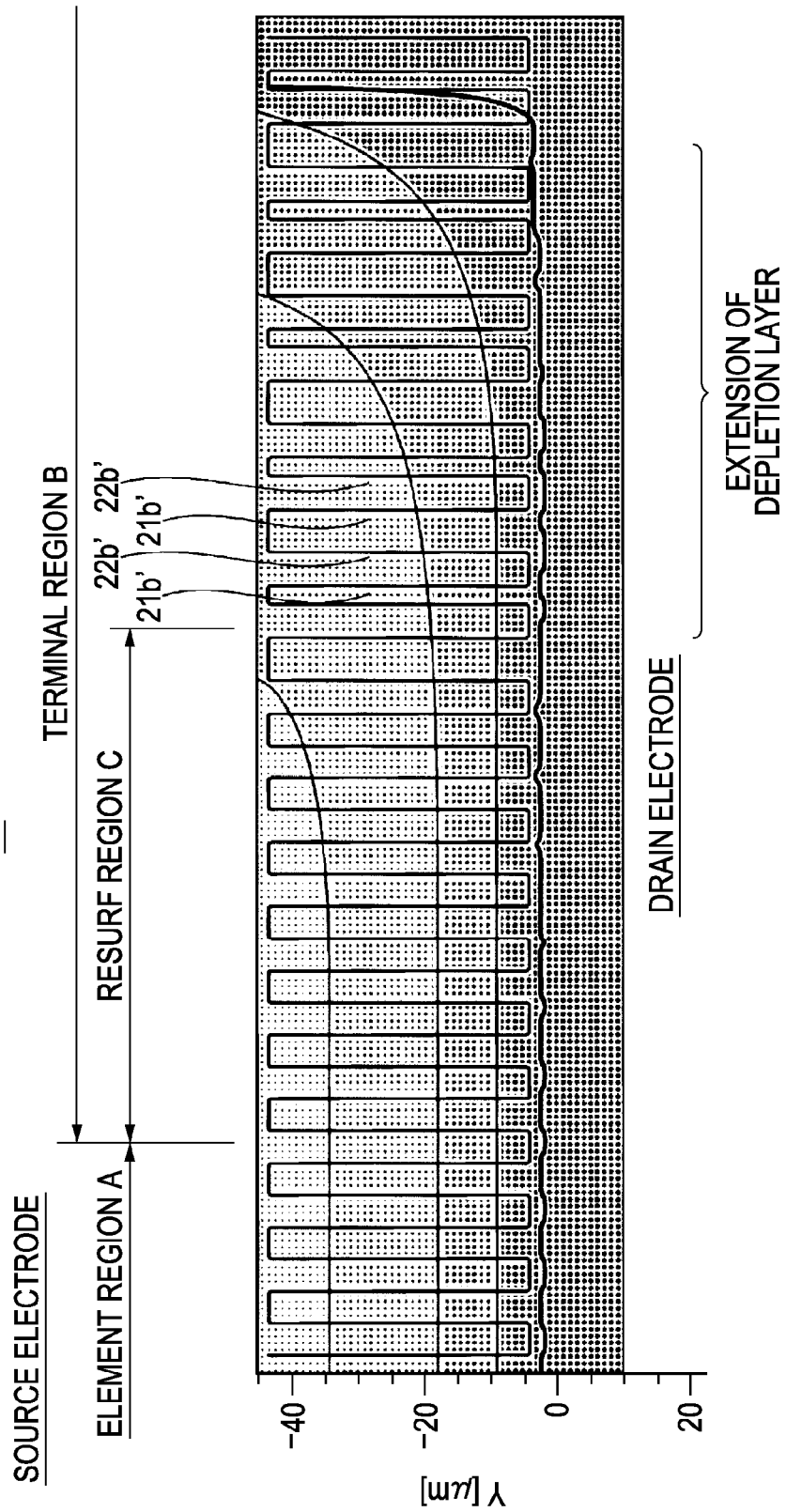
FIG. 4 is a view showing a potential distribution in a YZ plane of the semiconductor device according to the first embodiment.

In FIG. 4, a potential distribution in a YZ plane of the semiconductor device 1A having the terminal region B as described above is shown. As shown in FIG. 4, when the MOSFET is in an OFF state, the depletion layer can be more easily extended to the periphery of the MOSFET, and hence the concentration of electric field can be suppressed.

Figure 5:
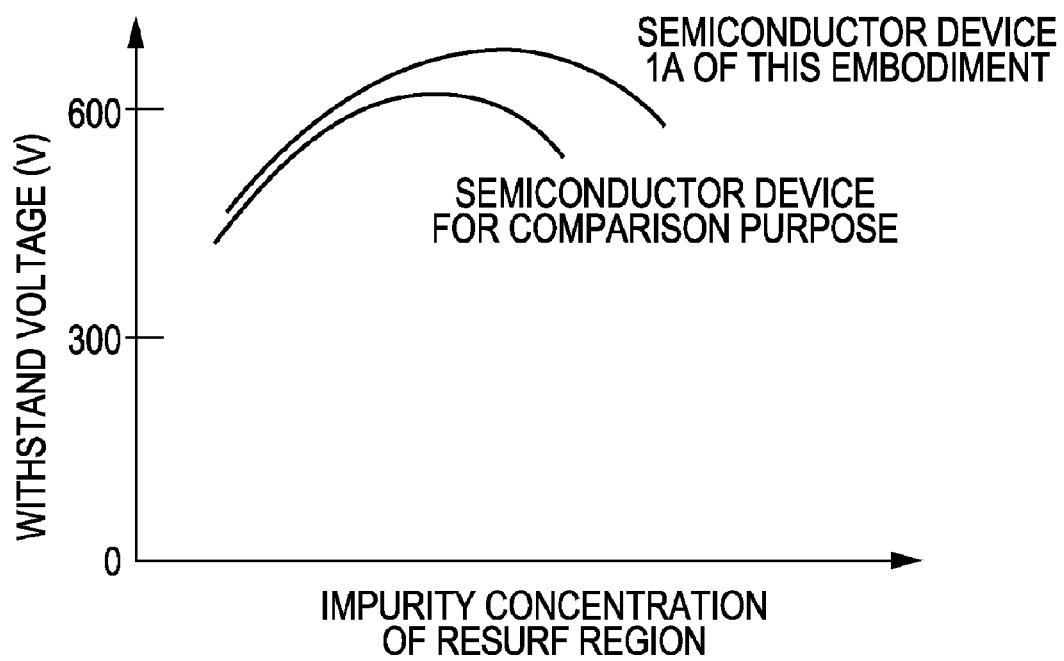
FIG. 5 is a graph showing the relationship between the withstand voltage and the impurity concentration of a resurf region.

In addition, in FIG. 5, the relationship between the withstand voltage and the impurity concentration of the resurf region C of the semiconductor device 1A of this embodiment and that of the semiconductor device prepared for comparison purpose are shown. As shown in FIG. 5, in the semiconductor device 1A of this embodiment, compared to the semiconductor device prepared for comparison purpose, the impurity concentration of the resurf region C can be increased while the withstand voltage is maintained. Hence, in the semiconductor device 1A, compared to the semiconductor device prepared for comparison purpose, the on-resistance can be further decreased.

(Method for Manufacturing Semiconductor Device 1A)

Next, a method for manufacturing the semiconductor device 1A of this embodiment will be described in detail with reference to the accompanying drawings.

Figure 6A:
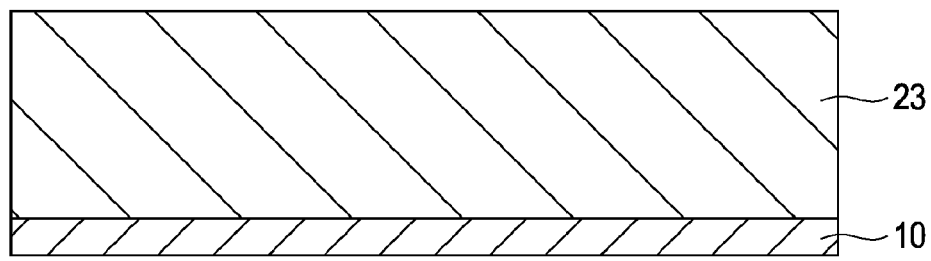
FIG. 6A is a view illustrating a step of manufacturing the semiconductor device according to the first embodiment.

First, as shown in FIG. 6A, for example, an n-type semiconductor substrate, such as Si, containing P, As, or Sb as an n-type impurity at a concentration $1 \times 10^{19}/cm^3$ or more is prepared as the n-type high concentration substrate 10. Subsequently, for example, an n-type semiconductor, such as Si, containing P as an n-type impurity at an impurity concentration of $2 \times 10^{15}$ to $2 \times 10^{16}/cm^3$ is grown on the n-type high concentration substrate 10 to form an n-type epitaxial layer 23 having a thickness of 40 to 60 μm.

Figure 6B:
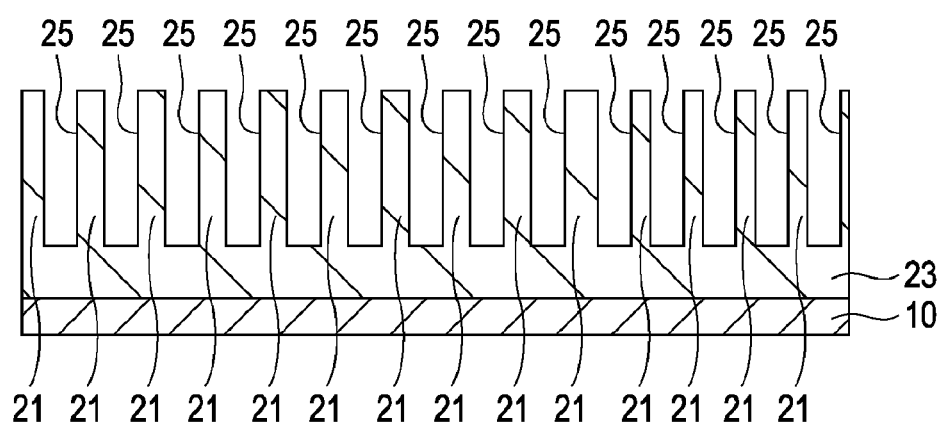
FIG. 6B is a view illustrating a step of manufacturing the semiconductor device according to the first embodiment.

Next, as shown in FIG. 6B, by using a resist mask (not shown) having a stripe pattern to form the p-type semiconductor pillar regions 22, the trench grooves 25 are formed in the n-type epitaxial layer 23 to have a depth of 35 to 55 μm. The trench grooves 25 are formed, for example, to have a width of 2 to 5 μm with pitches of 4 to 12 μm. In addition, in the terminal region B other than the resurf region C, the pitch between the trench grooves 25 is made different from that in the element region A and the resurf region C. As a result, the n-type semiconductor pillar regions 21b and 21c can be formed as described above.

In addition, as a method for forming the trench grooves 25, after a hard mask, such as a silicon oxide ($SiO_2$) film, is formed on the n-type epitaxial layer 23, dry etching may be performed, or a BOSCH process may be applied while a resist mask is used.

Figure 6C:
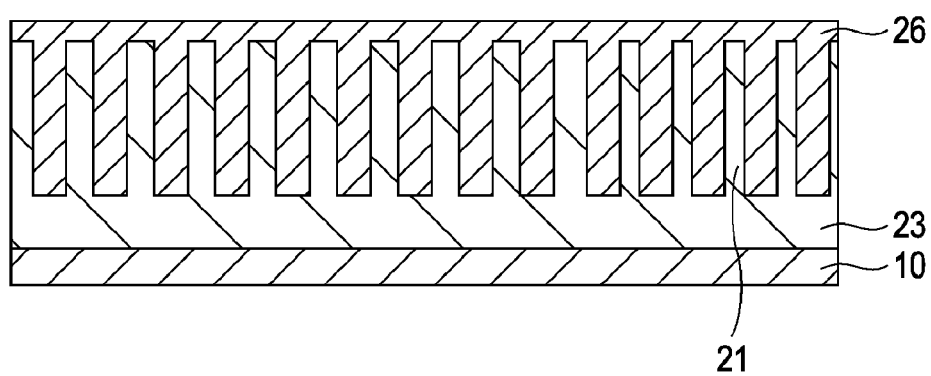
FIG. 6C is a view illustrating a step of manufacturing the semiconductor device according to the first embodiment.

Next, after the resist mask on a surface of the n-type epitaxial layer 23 in which the trench grooves 25 are formed is removed, as shown in FIG. 6C, Si or the like is epitaxially grown together with B inside the trench grooves 25, so that a p-type semiconductor 26 is formed therein. The impurity concentration of this p-type semiconductor 26 is, for example, $2 \times 10^{15}$ to $2 \times 10^{16}/cm^3$.

Figure 6D:
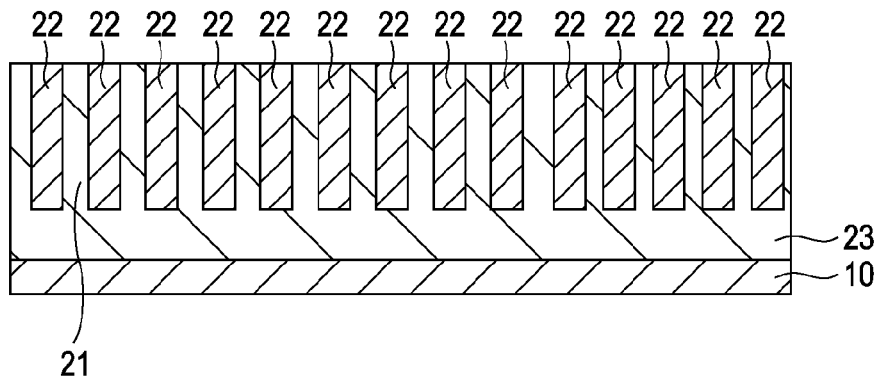
FIG. 6D is a view illustrating a step of manufacturing the semiconductor device according to the first embodiment.

Next, as shown in FIG. 6D, a surface of the p-type semiconductor 26 is polished by a chemical mechanical polishing (CMP) method to perform a mirror finishing treatment. In this step, the n-type epitaxial layer 23 is partially exposed. As a result, a super junction structure composed of the n-type semiconductor pillar regions 21 and the p-type semiconductor pillar regions 22 is formed.

Figure 6E:
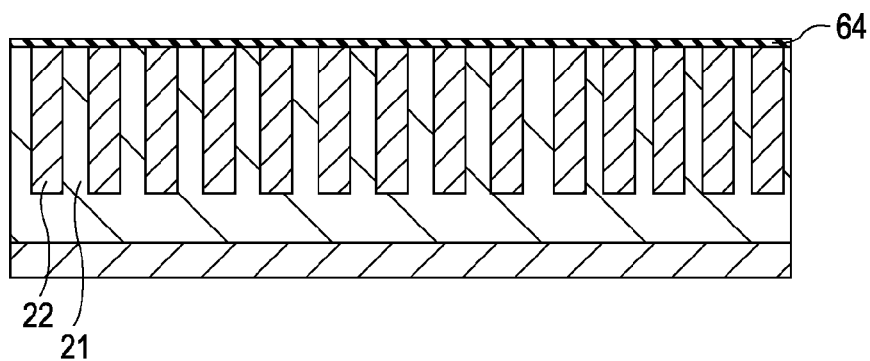
FIG. 6E is a view illustrating a step of manufacturing the semiconductor device according to the first embodiment.

Next, as shown in FIG. 6E, an insulating film 64 is formed on the n-type semiconductor pillar regions 21 and the p-type semiconductor pillar regions 22. This insulating film 64 functions as the gate insulating film 65 and is formed, for example, of a silicon oxide ($SiO_2$) film.

Figure 6F:
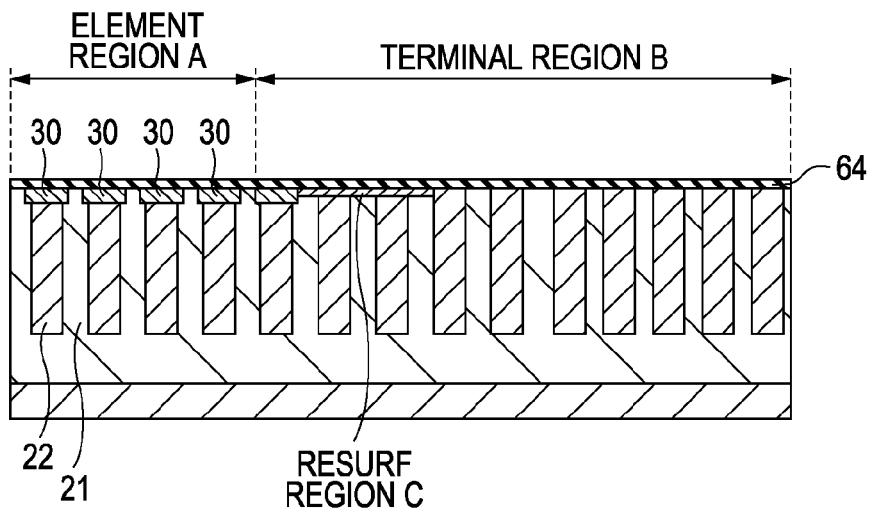
FIG. 6F is a view illustrating a step of manufacturing the semiconductor device according to the first embodiment.

Subsequently, a resist mask (not shown) is selectively formed on the insulating film 64 by a photolithographic technique. Next, by ion implantation using this resist mask, as shown in FIG. 6F, the p-type semiconductor regions 30 are formed on the p-type semiconductor pillar regions 22 in the element region A, and the resurf region C is further formed. This p-type semiconductor region 30 is formed of a p-type semiconductor, such as Si, containing B at an impurity concentration of $1 \times 10^{17}$ to $4 \times 10^{18}/cm^3$. This resurf region C is formed of a p-type semiconductor, such as Si, containing B at an impurity concentration of $1 \times 10^{16}$ to $3 \times 10^{17}/cm^3$ and is formed on the n-type semiconductor pillar regions 21 and the p-type semiconductor pillar regions 22 in a region which is a part of the terminal region B to surround the element region A.

Figure 6G:
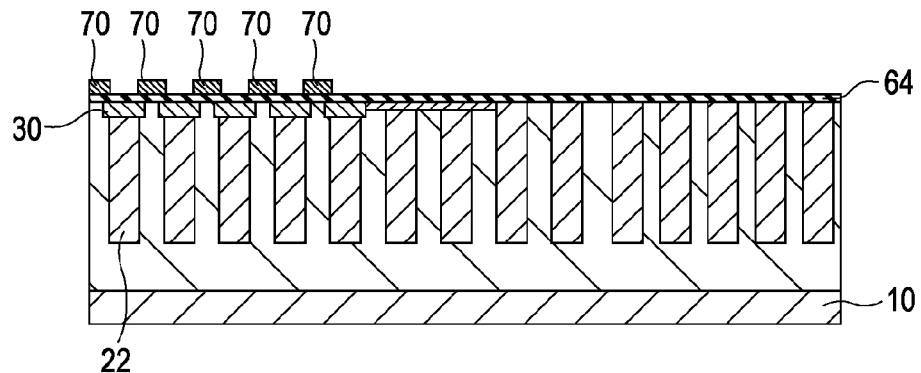
FIG. 6G is a view illustrating a step of manufacturing the semiconductor device according to the first embodiment.

Next, a metal layer composed of Cu (copper) is formed on the insulating film 64 by a chemical vapor deposition (CVD) method and is then selectively and partially removed by a photolithographic technique and an etching technique. As a result, as shown in FIG. 6G, the gate electrodes 70 are each formed on parts of adjacent p-type semiconductor regions 30 and one n-type semiconductor pillar region 21 provided therebetween.

In addition, although the metal layer is formed using Cu in this embodiment, the metal is not limited thereto and, for example, the metal layer may be formed using aluminum (Al) or titanium (Ti), or a multilayer structure in which the metal materials mentioned above are laminated may be used as the metal layer.

Figure 6H:
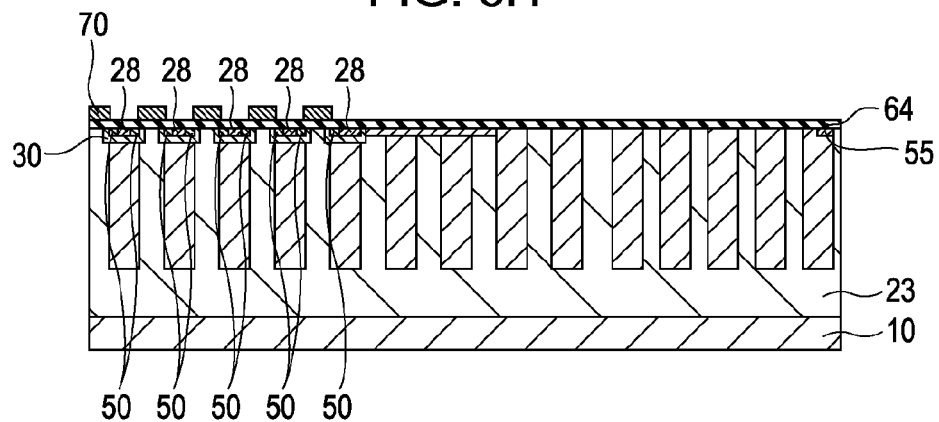
FIG. 6H is a view illustrating a step of manufacturing the semiconductor device according to the first embodiment.

In addition, as shown in FIG. 6H, B is selectively ion-implanted as a p-type impurity into parts of the surfaces of the p-type semiconductor regions 30 and part of a surface of the resurf region C to form $p^+$-type semiconductor regions 28. Furthermore, an n-type impurity is selectively ion-implanted in parts of surfaces of the $p^+$-type semiconductor regions 28 and in a part of the terminal region B. As a result, source regions 50 are formed in parts of the surfaces of the p-type semiconductor regions 30, and in an end portion of a surface of the p-type semiconductor pillar region 22 in the terminal region B or in an end portion of a surface of the n-type semiconductor pillar region 21b, a channel stopper 55 is formed. However, the channel stopper 55 may also be formed by a different step.

Figure 6I:
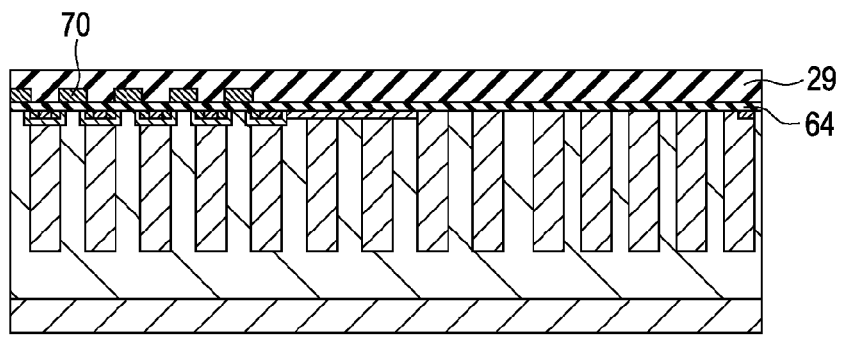
FIG. 6I is a view illustrating a step of manufacturing the semiconductor device according to the first embodiment.
Figure 6J:
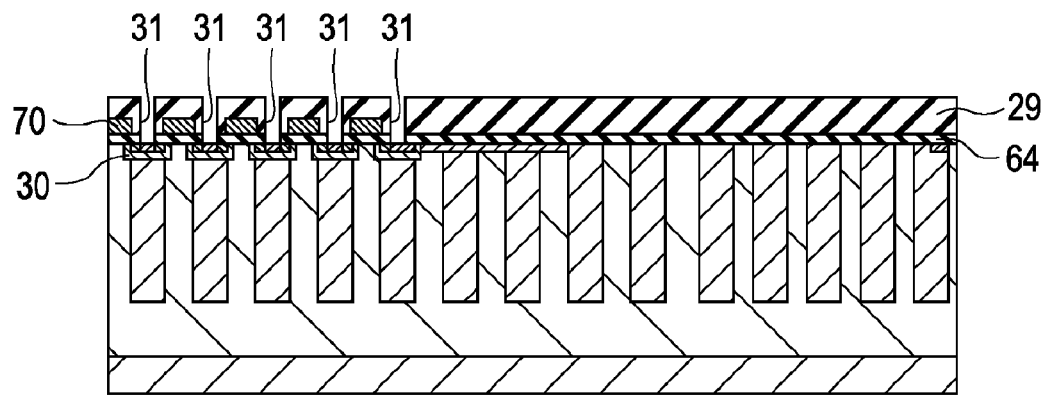
FIG. 6J is a view illustrating a step of manufacturing the semiconductor device according to the first embodiment.

Next, as shown in FIG. 6I, an interlayer insulating film 29 composed of $SiO_2$ is formed on the insulating film 64 including the gate electrodes 70 by a CVD method or the like. Subsequently, as shown in FIG. 6J, by using a photolithographic technique and an etching technique, the interlayer insulating film 29 and the insulating film 64 on the p-type semiconductor regions 30 in the element region A are selectively removed. As a result, contact holes 31 for the source electrode 60 are formed.

Figure 6K:
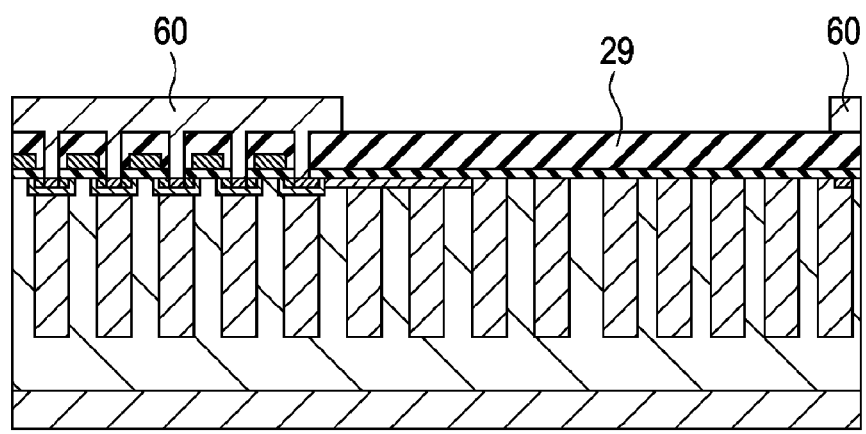
FIG. 6K is a view illustrating a step of manufacturing the semiconductor device according to the first embodiment.

Subsequently, as shown in FIG. 6K, the source electrode 60 is selectively formed, for example, by a CVD method and an etching technique using a metal layer of Cu or an aluminum-based alloy, such as Al—Cu, in a region including the contact holes 31. In addition, although the source electrode 60 is also formed using Cu, as in the gate electrode 70 described above, for example, aluminum (Al) or titanium (Ti) may also be used. Although not being shown in the figure, in this step, a metal layer to be formed into gate wires is simultaneously formed.

Figure 6L:
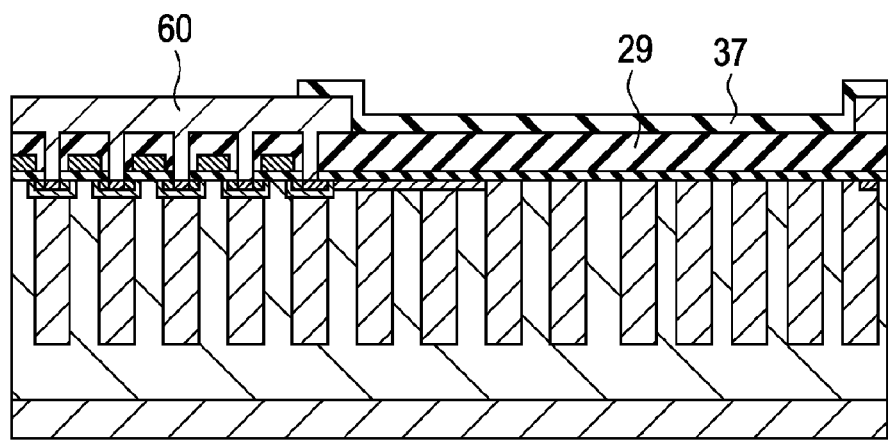
FIG. 6L is a view illustrating a step of manufacturing the semiconductor device according to the first embodiment.
Figure 6M:
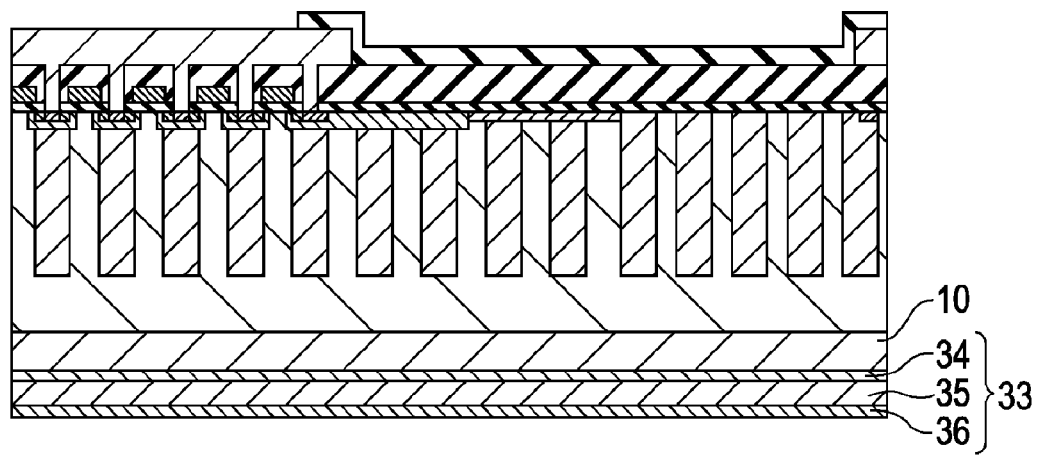
FIG. 6M is a view illustrating a step of manufacturing the semiconductor device according to the first embodiment.

Next, as shown in FIG. 6L, a protective film 37 composed, for example, of silicon nitride (SiN) is selectively formed on the interlayer insulating film 29 and on part of the source electrode 60. In addition, as shown in FIG. 6M, a bottom surface of the n-type high concentration substrate 10 is polished so that the thickness thereof is decreased to 100 to 200 µm. Subsequently, a metal film 33 is formed on the bottom surface of this n-type high concentration substrate 10 by an electron beam (EB) deposition method or the like. In this embodiment, although the metal film 33 is formed by the EB deposition method mentioned above, the method is not limited thereto, and the metal film 33 may also be formed using a CVD method, a sputtering method, a plating method, or the like.

The metal film 33 may be formed of a three-layered film including a Ti layer 34, a nickel (Ni) layer 35, and a gold (Au) layer 36. This metal film 33 functions as a drain electrode. As described above, the semiconductor device 1A including a super junction vertical MOSFET which has a source electrode, a drain electrode, and gate electrodes can be formed.

As described above, since the semiconductor device 1A can be formed by a method for manufacturing an epitaxial-layer filled trench groove, the process is simplified, and manufacturing can be performed at a low cost.

As described above, in the semiconductor device 1A of this embodiment, the widths of the p-type semiconductor pillar regions 22a, 22b, and 22c formed from the element region A to the terminal region B are each set as the first width w1. In addition, the width of each n-type semiconductor pillar region 21a formed in the element region A and the width of each n-type semiconductor pillar region 21a connected to the resurf region C in the terminal region B are each set as the second width w2.

Furthermore, the widths of the n-type semiconductor pillar regions 21b and 21c which are formed in the terminal region B and which are not connected to the resurf region C are changed in a periodic manner. That is, in a direction apart from the element region A along the Y axis direction, the n-type semiconductor pillar region 21b having a third width w3 which is smaller than the second width w2 and the n-type semiconductor pillar region 21c having a width w4 are alternately disposed in this order.

Furthermore, in the p-type semiconductor pillar regions 22b and 22c which are formed in the terminal region B and which are not connected to the resurf region C, adjacent p-type semiconductor pillar regions 22b and 22c with the n-type semiconductor pillar region 21 interposed therebetween are connected to each other with a connection portion formed of the $p^+$-type semiconductor 80.

By the structure described above, in the terminal region of the super junction vertical MOSFET, the depletion layer can be more easily extended to the periphery of the element when the MOSFET is in an OFF state, and hence the generation of electric field concentration can be suppressed.

As a result, in the terminal region B, charge balance can be obtained, and the electric field is likely to be distributed parallel to the surface of the drain electrode and that of the source electrode. Accordingly, a stable super junction vertical MOSFET having a high withstand voltage can be provided.

In addition, since the optimal terminal region structure is realized by a method for manufacturing an epitaxial-layer filled trench groove, the impurity concentration of the n-type semiconductor pillar region 21 can be increased, and furthermore, a low on-resistance can be achieved. In addition, since the manufacturing process is simple, manufacturing can be performed at a low cost.

In addition, when the widths of some n-type semiconductor pillar regions 21b in the terminal region B are decreased, the size of the terminal region B can be efficiently reduced, and hence the chip size can also be reduced.

Second Embodiment

Next, a semiconductor device 1B according to a second embodiment will be described. FIGS. 7A and 7B are views each illustrating the semiconductor device 1B according to the second embodiment.

In this semiconductor device 1B, the widths of the p-type semiconductor pillar regions 22, that is, the widths of the trench grooves 25, are each the first width w1 as in the case of the semiconductor device 1A according to the first embodiment and are uniform from the element region A to the terminal region B. Since the widths of the p-type semiconductor pillar regions 22 are uniform as described above, when the trench grooves 25 are filled with a p-type semiconductor by an epitaxial growth, filling can be uniformly performed in a wafer surface.

On the other hand, the widths of the n-type semiconductor pillar regions 21 inside and outside the resurf region C are different from each other. First, the width of each n-type semiconductor pillar region 21a in the element region A is set as the second width w2, and as in the case described above, among the n-type semiconductor pillar regions 21 in the terminal region B, the width of each n-type semiconductor pillar region 21a connected to the resurf region C is set as the second width w2. In addition, in the n-type semiconductor pillar regions 21 in the terminal region B, the width of each n-type semiconductor pillar region 21 which is not connected to the resurf region C is set as follows.

That is, the n-type semiconductor pillar region 21b having a third width w3 smaller than the width w2 and an n-type semiconductor pillar region 21c' having a fourth width w4' larger than the second width w2 are alternately arranged in a direction apart from the element region A along the Y axis direction.

In addition, a $p^+$-type high concentration semiconductor 80' is formed on the n-type semiconductor pillar region 21c' having a fourth width w4', so that adjacent p-type semiconductor pillar regions 22b and 22c with the n-type semiconductor pillar region 21c' interposed therebetween are electrically connected to each other with the $p^+$-type high concentration semiconductor 80'. This $p^+$-type high concentration semiconductor 80' has an impurity concentration approximately equivalent to that of a p-type semiconductor forming the p-type semiconductor region 30 in the element region A.

As described above, the width of the n-type semiconductor pillar region 21c' provided between the p-type semiconductor pillar regions 22b and 22c electrically connected by the $p^+$-type semiconductor 80' is set larger than the width of the n-type semiconductor pillar regions 21a in the element region A and that connected to the resurf region C. Hence, when the n-type semiconductor pillar region 21c' having a large width and the n-type semiconductor pillar region 21b having a small width are considered as one pair, the structure is formed in which the perfect charge balance can be obtained. Accordingly, the electric field is more likely to be distributed parallel to the surface of the drain electrode and that of the source electrode.

In addition, in the semiconductor device 1B, as shown in FIGS. 7A and 7B, at least two pairs of the p-type semiconductor pillar regions 22b and 22c connected by the $p^+$-type semiconductor 80' are present.

Since the semiconductor device 1B is formed as described above, when the MOSFET is in an OFF state, the depletion layer can be extended outside further from the resurf region C. As a result, the electric field in the super junction region is uniformed, and the generation of points of electric field concentration can be suppressed, so that the withstand voltage of the MOSFET can be improved. Furthermore, a super junction vertical MOSFET which suppresses fluctuations caused by manufacturing variations can be provided.

Third Embodiment

Next, a semiconductor device 1C according to a third embodiment will be described. FIGS. 8A and 8B are views each illustrating the semiconductor device 1C according to the third embodiment.

In the semiconductor device 1C according to the third embodiment, the length of the $p^+$-type semiconductor 80 in a long side direction (X axis direction) is set equal to the length of the resurf region C in a long side direction (X axis direction).

Furthermore, in the semiconductor device 1C, $p^-$-type semiconductors 51 are connected to two ends of the $p^+$-type semiconductor 80 in the long side direction (X axis direction), the $p^-$-type semiconductor 51 having the same concentration as that of the resurf region C. That is, on the n-type semiconductor pillar region 21c on which the $p^+$-type semiconductor 80 is formed, the $p^-$-type semiconductors 51 are formed adjacent thereto.

Since the $p^-$-type semiconductors 51 are provided as described above, when the MOSFET is in an OFF state, and a voltage is applied to the drain electrode, the $p^-$-type semiconductors 51 are depleted. Accordingly, in the terminal region B, the region of the depletion layer can be extended.

The structure described above can also be applied to the structure of the semiconductor device 1B according to the second embodiment as shown in FIGS. 9A and 9B.

That is, as shown in FIGS. 9A and 9B, in a semiconductor device 1C', the length of the $p^+$-type semiconductor 80' in a long side direction (X axis direction) is set equal to the length of the resurf region C. That is, the two end positions of the $p^+$-type semiconductor 80' in the X axis direction are set to approximately coincide with the two end positions of the resurf region C in the X axis direction. Furthermore, in the semiconductor device 1C', $p^-$-type semiconductors 51' having the same concentration as that of the resurf region C are connected to two ends of the n-type semiconductor pillar region 21c' in a long side direction (X axis direction). As a result, as in the semiconductor device 1C, the region of the depletion layer can be extended in the terminal region B.

Fourth Embodiment

Next, a semiconductor device 1D according to a fourth embodiment will be described. FIGS. 10A and 10B are views each illustrating the semiconductor device 1D according to the fourth embodiment.

In the semiconductor device 1D according to the fourth embodiment, instead of using the $p^+$-type semiconductors 80 of the semiconductor device 1A according to the first embodiment, metal wires 52 are provided.

That is, in the semiconductor device 1A according to the first embodiment, the $p^+$-type semiconductor 80 is provided on the n-type semiconductor pillar region 21c, and the p-type semiconductor pillar regions 22b and 22c are electrically connected to each other with this p$^+$-type semiconductor 80.

On the other hand, in the semiconductor device 1D, the p$^+$-type semiconductor 80 is not provided on the n-type semiconductor pillar region 21c. Instead of the p$^+$-type semiconductor 80, in the semiconductor device 1D, contact holes are formed in the interlayer insulating film 29 on the p-type semiconductor pillar regions 22b and 22c, and the p-type semiconductor pillar regions 22b and 22c are electrically connected to each other with the metal wire 52 through the contact holes. As described above, by using the metal wire 52, the electrical connection between the p-type semiconductor pillar regions 22b and 22c can be made more reliable.

Since the metal wires 52 are simultaneously formed when the source electrode 60 is formed, without increasing the number of steps, the electrical connection between the p-type semiconductor pillar regions 22b and 22c can be achieved.

Figure 11A:
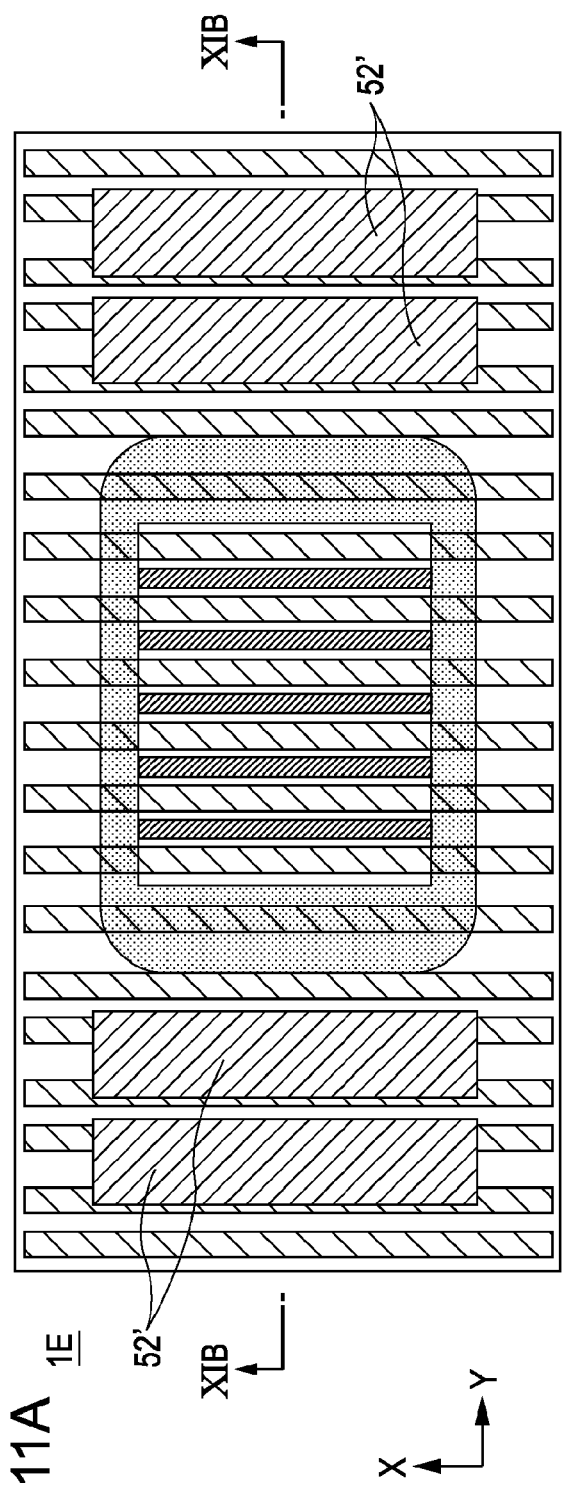
FIGS. 11A and 11B are views each illustrating the structure of another semiconductor device according to the fourth embodiment.
Figure 11B:
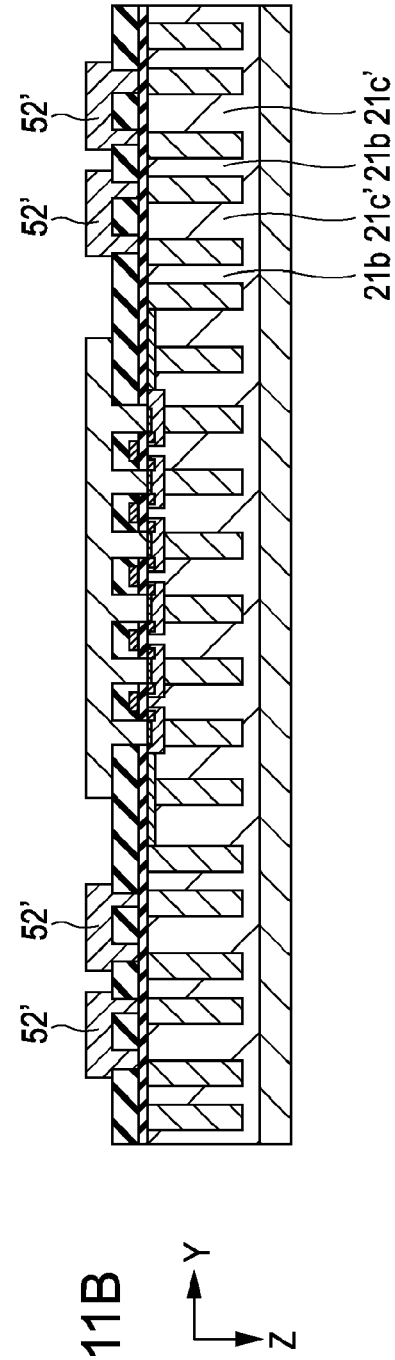

Although the case in which the p$^+$-type semiconductor 80 of the semiconductor device 1A according to the first embodiment is replaced with the metal wire 52 is described by way of example, the structure is not limited thereto. For example, as shown in a semiconductor device 1E of FIGS. 11A and 11B, instead of the p$^+$-type semiconductors 80' of the semiconductor device 1B according to the second embodiment, metal wires 52' may be provided.

Figure 12A:
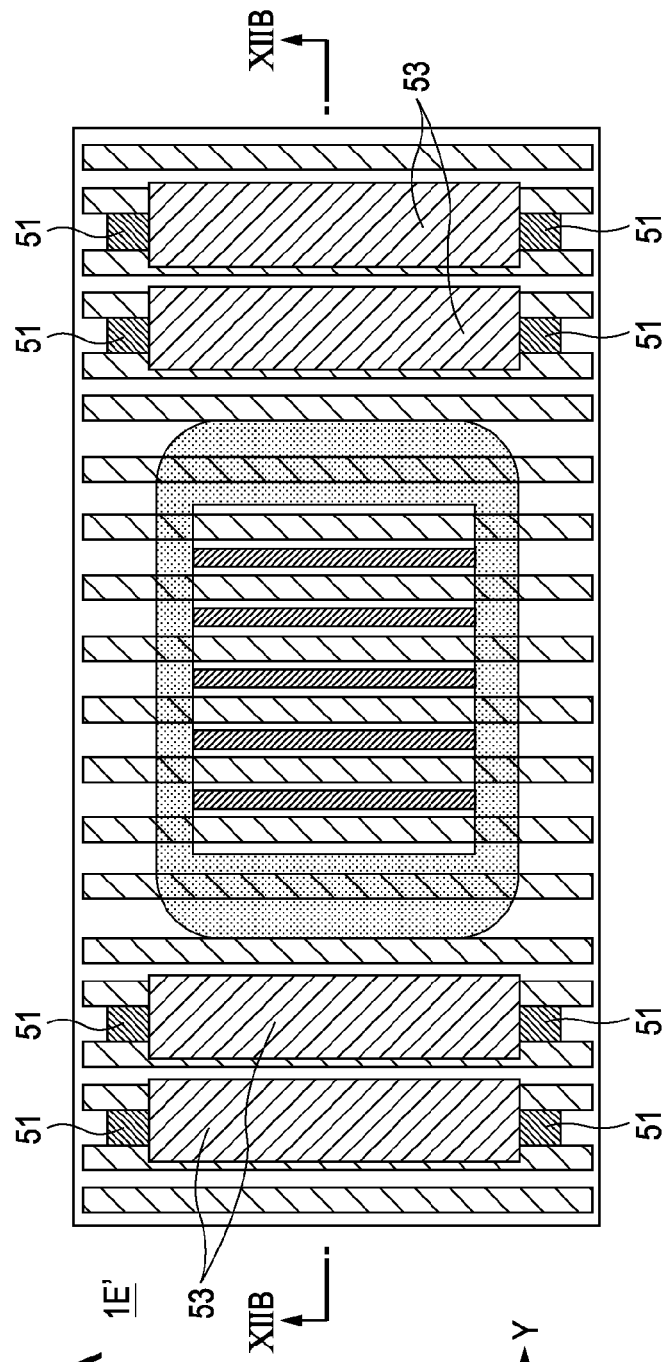
FIGS. 12A and 12B are views each illustrating the structure of another semiconductor device according to the fourth embodiment.
Figure 12B:
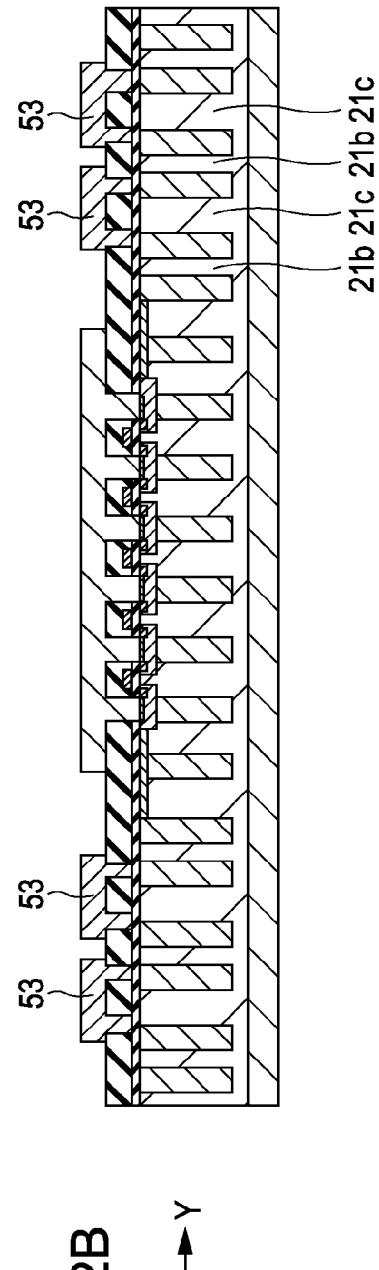
Figures 13A, 13B:
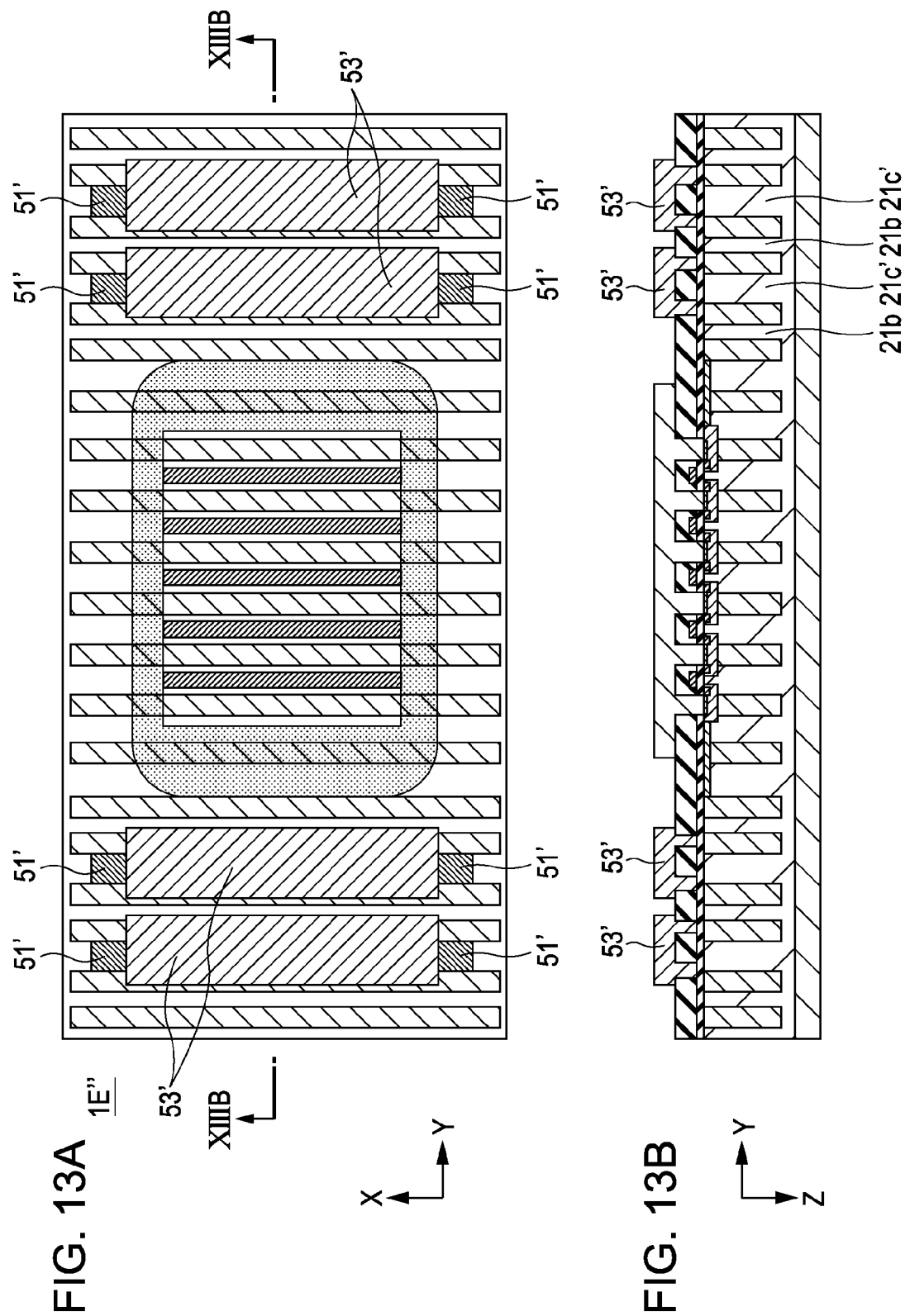
FIGS. 13A and 13B are views each illustrating the structure of another semiconductor device according to the fourth embodiment.

In addition, as shown in a semiconductor device 1E' of FIGS. 12A and 12B, instead of the p$^+$-type semiconductors 80 of the semiconductor device 1C according to the third embodiment, metal wires 53 may be provided. In addition, as shown in a semiconductor device 1E" of FIGS. 13A and 13B, instead of the p$^+$-type semiconductors 80' of the semiconductor device 1C' according to the third embodiment, metal wires 53' may be provided. In this case, as in the semiconductor devices 1C and 1C', the p$^-$-type semiconductors 51 and 51' each having the same concentration as that of the resurf region C are connected to two ends of the metal wire 53 and 53', respectively, in a long side direction (X axis direction).

As described above, in the semiconductor device according to this embodiment, the widths of the n-type semiconductor pillar regions formed in the terminal region and provided with no resurf region thereon are periodically changed. That is, in a direction apart from the element region along the Y axis direction, the n-type semiconductor pillar region having a third width smaller than the second width and the n-type semiconductor pillar region having a fourth width are alternately arranged in this order. Furthermore, in the p-type semiconductor pillar regions which are formed in the terminal region and which are not connected to the resurf region, adjacent p-type semiconductor pillar regions with the n-type semiconductor pillar region interposed therebetween are connected by the connection portion composed of the p$^+$-type semiconductor.

According to the structure described above, in the terminal region of the super junction vertical MOSFET, the depletion layer can be easily extended to the periphery of the element when the MOSFET is in an OFF state, and the generation of electric field concentration can be suppressed.

As a result, in the terminal region B, the charge balance can be obtained, and the electric field is likely to be distributed parallel to the surface of the drain electrode and that of the source electrode. Hence, a stable super junction vertical MOSFET having a high withstand voltage can be provided. In addition, since the optimal terminal structure is realized by a method for manufacturing an epitaxial-layer filled trench groove, the impurity concentration of the n-type semiconductor pillar region can be increased, and further, a low on-resistance can be realized. Furthermore, since the manufacturing process is simple, manufacturing can be performed at a low cost.

Heretofore, although several embodiments of the present invention have been described in detail with reference to the accompanying drawings, these embodiments are merely described by way of example, and based on the knowledge of a person skilled in the art, the present invention may be carried out in accordance with other embodiment which are obtained by various modifications and changes.

The structure described above may be applied to any vertical operation device having a super junction structure and may also be applied to a discrete element, such as a superlattice bipolar transistor (SBT) or an insulated gate bipolar transistor (IGBT) as well as to a MOSFET. In addition, the structure may also be applied to a device using silicon carbide as a material.

The present application contains subject matter related to that disclosed in Japanese Priority Patent Application JP 2009-204661 filed in the Japan Patent Office on Sep. 4, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
a semiconductor substrate of a first conductive type;
a first semiconductor region provided on an upper surface of the semiconductor substrate and including a region in which first pillar regions of the first conductive type and second pillar regions of a second conductive type, each having a long side in a first direction that is parallel to the upper surface of the semiconductor substrate, are alternately arranged in a second direction that is parallel to the upper surface of the semiconductor substrate and that is orthogonal to the first direction, the first and second pillar regions being in an element region in which a semiconductor element is formed and also being in a terminal region that surrounds the element region;
second semiconductor regions of the second conductive type on surfaces of the second pillar regions in the element region so as to be in contact with the first pillar regions in the element region;
gate electrodes that are each on parts of adjacent second semiconductor regions and on one of the first pillar regions interposed therebetween, a gate insulating film being under the gate electrodes;
third semiconductor regions of the first conductive type that each function as a source region in parts of surfaces of the second semiconductor regions located under side portions of the gate electrodes; and
a reduced surface field ("resurf") region of the second conductive type, the resurf region being a part of the terminal region and being disposed on the first pillar regions and the second pillar regions in the part of the terminal region,
wherein,
widths of the second pillar regions in the element region and in the terminal region are each set as a first width, and widths of the first pillar regions in the element region and widths of the first pillar regions connected to the resurf region in the terminal region are each set as a second width, the first pillar regions that are in the terminal region and that are not connected to the resurf region are arranged such that a first pillar region having a third width smaller than the second width and a first pillar region having a fourth width different from the third width are alternately arranged in this order in a direction away from the element region along the second direction, and among the second pillar regions that are in the terminal region and that are not connected to the resurf region, adjacent second pillar regions with the first pillar region having the fourth width interposed therebetween are connected to each other with a connection portion composed of a semiconductor of the second conductive type or a conductor.

2. The semiconductor device according to claim 1, wherein the fourth width is larger than the second width.

3. The semiconductor device according to claim 1 or 2, wherein the connection portion includes a semiconductor of the second conductive type having an impurity concentration higher than an impurity concentration of the resurf region.

4. The semiconductor device according to claim 3, wherein:
a length of the connection portion and a length of the resurf region are equal to each other in the first direction, and
the semiconductor device further comprises semiconductor regions of the second conductive type having an impurity concentration equal to an impurity concentration of the resurf region and being respectively at two ends of the connection portion in the first direction.

5. The semiconductor device according to claim 1 or 2, wherein the connection portion includes a metal wire.

6. The semiconductor device according to claim 5, wherein:
a length of the connection portion and a length of the resurf region are equal to each other in the first direction, and
the semiconductor device further comprises semiconductor regions of the second conductive type having an impurity concentration equal to an impurity concentration of the resurf region and being respectively at two ends of the connection portion in the first direction.

7. The semiconductor device according to claim 1 or 2, wherein:
a length of the connection portion and a length of the resurf region are equal to each other in the first direction, and
the semiconductor device further comprises semiconductor regions of the second conductive type having an impurity concentration equal to an impurity concentration of the resurf region and being respectively at two ends of the connection portion in the first direction.

8. The semiconductor device according to claim 1 or 2, wherein the first semiconductor region is a region formed by (i) forming a plurality of trench grooves in a semiconductor layer of the first conductive type provided on the upper surface of the semiconductor substrate to form the first pillar regions between the trench grooves and (ii) filling a semiconductor of the second conductive type in the trench grooves by an epitaxial growth to form the second pillar regions.

9. A method for manufacturing a semiconductor device comprising the steps of:
forming a semiconductor layer of a first conductive type on a semiconductor substrate of the first conductive type;
forming trench grooves in the semiconductor layer to form first pillar regions of the first conductive type between the trench grooves, the grooves each having a long side in a first direction that is parallel to an upper surface of the semiconductor substrate and being arranged in a second direction that is parallel to the upper surface of the semiconductor substrate and that is orthogonal to the first direction;
filling a semiconductor of a second conductive type in the trench grooves by an epitaxial growth to form second pillar regions, the first and second pillar regions being formed in an element region in which a semiconductor element is formed and also being formed in a terminal region that surrounds the element region;
forming second semiconductor regions of the second conductive type on surfaces of the second pillar regions in the element region so as to be in contact with the first pillar regions in the element region;
forming gate electrodes each of which is formed on parts of adjacent second semiconductor regions and on one of the first pillar region interposed therebetween, a gate insulating film being formed under the gate electrodes;
forming third semiconductor regions of the first conductive type that each function as a source region in parts of the second semiconductor regions located under side portions of the gate electrodes; and
forming a reduced surface field ("resurf") region of the second conductive type, the resurf region being a part of the terminal region, the resurf region being formed on the first pillar regions and the second pillar regions in the part of the terminal region,
wherein,
in the step of forming trench grooves, the trench grooves are formed so that widths of the second pillar regions formed in the element region and in the terminal region are each set as a first width, widths of the first pillar regions formed in the element region and widths of the first pillar regions connected to the resurf region in the terminal region are each set as a second width,
the first pillar regions that are formed in the terminal region and that not connected to the resurf region are arranged such that a first pillar region having a third width smaller than the second width and a first pillar region having a fourth width different from the third width are alternately arranged in this order in a direction away from the element region along the second direction, and
among the second pillar regions that are formed in the terminal region and that are not connected to the resurf region, adjacent second pillar regions with the first pillar region having the fourth width interposed therebetween are connected to each other by forming a connection portion including a semiconductor of the second conductive type or a conductor.

* * * * *